(12) United States Patent
Rodrigues Augusto et al.

(10) Patent No.: US 12,261,237 B2
(45) Date of Patent: Mar. 25, 2025

(54) PHOTOVOLTAIC DEVICES WITH VERY HIGH BREAKDOWN VOLTAGES

(71) Applicants: Andre Filipe Rodrigues Augusto, Tempe, AZ (US); Apoorva Srinivasa, Beaverton, OR (US); Stuart Bowden, Tempe, AZ (US)

(72) Inventors: Andre Filipe Rodrigues Augusto, Tempe, AZ (US); Apoorva Srinivasa, Beaverton, OR (US); Stuart Bowden, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 17/734,737

(22) Filed: May 2, 2022

(65) Prior Publication Data

US 2022/0359778 A1 Nov. 10, 2022

Related U.S. Application Data

(60) Provisional application No. 63/182,216, filed on Apr. 30, 2021.

(51) Int. Cl.
*H01L 31/18* (2006.01)
*H01L 31/0288* (2006.01)
(Continued)

(52) U.S. Cl.
CPC ...... *H01L 31/0512* (2013.01); *H01L 31/0288* (2013.01); *H01L 31/077* (2013.01); *H01L 31/1868* (2013.01)

(58) Field of Classification Search
CPC ............. H01L 31/0512; H01L 31/0288; H01L 31/077; H01L 31/1868
See application file for complete search history.

(56) References Cited

U.S. PATENT DOCUMENTS

| | | | |
|---|---|---|---|
| 8,611,756 B1 * | 12/2013 | Wach | G02B 6/43 398/140 |
| 10,256,362 B2 | 4/2019 | Augusto et al. | |

(Continued)

FOREIGN PATENT DOCUMENTS

| | | | | |
|---|---|---|---|---|
| JP | 2011060970 A | * | 3/2011 | ............. H01L 31/04 |
| JP | 2018107303 A | | 7/2018 | |

OTHER PUBLICATIONS

Translation of JP-2011060970-A (Year: 2011).*

(Continued)

*Primary Examiner* — Tamir Ayad
(74) *Attorney, Agent, or Firm* — Withrow & Terranova, P.L.L.C.

(57) ABSTRACT

Photovoltaic devices with very high breakdown voltages are described herein. Typical commercial silicon photovoltaic devices have breakdown voltages below 50-100 volts (V). Even though such devices have bypass diodes to prevent photovoltaic cells from going into breakdown, the bypass diodes have high failure rates, leading to unreliable devices. A high-efficiency silicon photovoltaic cell is provided with very high breakdown voltages. By combining a device architecture with very low surface recombination and silicon wafers with high bulk resistivity (above 10 ohms centimeter ($\Omega$-cm)), embodiments described herein achieve breakdown voltages close to 1000 V. These photovoltaic cells with high breakdown voltages improve the reliability of photovoltaic devices, while reducing their design complexity and cost.

5 Claims, 27 Drawing Sheets

(51) Int. Cl.
    *H01L 31/05*      (2014.01)
    *H01L 31/077*     (2012.01)

(56) References Cited

U.S. PATENT DOCUMENTS

| | | | |
|---|---|---|---|
| 2003/0213915 A1* | 11/2003 | Chao | H01L 27/14643 |
| | | | 438/73 |
| 2015/0214392 A1* | 7/2015 | Buckley | H01L 31/0747 |
| | | | 438/96 |
| 2017/0098723 A1 | 4/2017 | Oh et al. | |
| 2018/0102442 A1* | 4/2018 | Wang | H01L 31/02327 |
| 2021/0376788 A1 | 12/2021 | Bowden et al. | |
| 2022/0248648 A1 | 8/2022 | Bailly et al. | |
| 2022/0262972 A1 | 8/2022 | Honsberg et al. | |

OTHER PUBLICATIONS

Alonso-Garcia, M.C. et al., "Analysis and modelling the reverse characteristic of photovoltaic cells," Solar Energy Materials and Solar Cells, vol. 90, Issue 7-8, 2006, available online Aug. 2005, Elsevier, 16 pages.

Altermatt, P.P. et al., "Injection dependence of spontaneous radiative recombination in c-Si: experiment, theoretical analysis, and simulation," Proceedings of the 5th International Conference on Numerical Simulation of Optoelectronic Devices, Sep. 2005, Berline, Germany, IEEE, 2 pages.

Augusto, A. et al., "Analysis of the recombination mechanisms of a silicon solar cell with low bandgap-voltage offset," Journal of Applied Physics, vol. 121, No. 20, May 2017, AIP Publishing, 7 pages.

Augusto, A. et al., "Impact of undoped substrates on high performance silicon solar cells," Final Technical Report (FTR), DOE/EERE/Solar Energy Technology Office, Sep. 28, 2020, 29 pages.

Augusto, A. et al., "Influence of the Bulk resistivity on Silicon Heterojunction Solar Cells and Module Reliability," RRL Solar, vol. 6, Issue 5, Special Issue EU PVSEC, May 2022, Wiley-VCH GmbH, 7 pages.

Augusto, A. et al. "Performance of silicon heterojunction solar cells using high resistivity substrates," IEEE 46th Photovoltaic Specialists Conference, Jun. 2019, Chicago, IL, IEEE, 4 pages.

Breitenstein, O. et al., "Understanding junction breakdown in multicrystalline solar cells," Journal of Applied Physics, vol. 109, Apr. 2011, American Institutes of Physics, 11 pages.

Chu, H. et al., "Soft Breakdown Behavior of Interdigitated-back-contact Silicon Solar Cells," Energy procedia, vol. 77, Aug. 2015, pp. 29-35.

Coletti, G., "Sensitivity of state-of-the-art and high efficiency crystalline silicon solar cells to metal impurities," Progress in Photovoltaics, vol. 21, Issue 5, Aug. 2013, 8 pages.

Geerlings, L.J. et al., "Base Doping and Recombination Activity of Impurities in Crystalline Silicon Solar Cells," Progress in Photovoltaics, vol. 12, Issue 4, Jun. 2004, John Wiley & Sons, Ltd., 8 pages.

Kurtz, S. et al., "Evaluation of high-temperature exposure of photovoltaic modules," 2009 34th IEEE Photovoltaic Specialists Conference (PVSC), Jun. 2009, Philadelphia, PA, IEEE, 9 pages.

MacDonald, D. et al., "Recombination activity of iron-boron pairs in compensated p-type silicon," Physica Status Solidi B, Basic Solid State Physics, vol. 247, Issue 9, Sep. 2010, first published Aug. 2010, 4 pages.

McIntosh, K.R. et al., "On effective surface recombination parameters," Journal of Applied Physics, vol. 116, Issue 1, Jul. 2014, AIP Publishing, 11 pages.

Misiakos, K. et al., "Accurate measurements of the silicon intrinsic carrier density from 78 to 340 K," Journal of Applied Physics, vol. 74, Issue 5, Sep. 1993, pp. 3293-3297.

Richter, A. et al., "Impact of bulk impurity contamination on the performance of high-efficiency n-type silicon solar cells," Progress in Photovoltaics, vol. 26, Issue 5, May 2018, pp. 342-350.

Richter, A. et al., "Improved quantitative description of Auger recombination in crystalline silicon," Physical Review B, vol. 86, Issue 16, Oct. 2012, 14 pages.

Richter, A. et al., "n-Type Si solar cells with passivating electron contact: Identifying sources for efficiency limitations by wafer thickness and resistivity variation," Solar Energy Materials and Solar Cells, vol. 173, Dec. 2017, Elsevier, pp. 96-105.

Schenk, A., "Finite-temperature full random-phase approximation model of band gap narrowing for silicon device simulation," Journal of Applied Physics, vol. 84, Issue 7, Oct. 1998, 13 pages.

Schmidt, J. et al., "Impurity-Related Limitations of Next-Generation Industrial Silicon Solar Cells," IEEE Journal of Photovoltaics, vol. 3, Issue 1, Jun. 2013, 6 pages.

Seif, J.P. et al., "Amorphous/Crystalline Silicon Interface Passivation: Ambient-Temperature Dependence and Implications for Solar Cell Performance," IEEE Journal of Photovoltaics, vol. 5, Issue 3, May 2015, first published Mar. 2015, IEEE, 7 pages.

Singh, P. et al., "Temperature dependence of solar cell performance—an analysis," Solar Energy Materials and Solar Cells, vol. 101, Jun. 2012, Elsevier, 10 pages.

Srinivasa, A. et al., "Effect of Substrate Resistivity, Defects and Temperature on Silicon Heterojunction Solar Cells Performance," 2020 IEEE 47th Photovoltaic Specialists Conference (PVSC), Jun. 2020, Calgary, AB, Canada, IEEE, 4 pages.

Steinkemper, H. et al., "Comprehensive simulation study of industrially relevant silicon solar cell architectures for an optimal material parameter choice," Progress in Photovoltaics, vol. 24, Issue 10, Oct. 2016, first published Jun. 2016, 13 pages.

\* cited by examiner

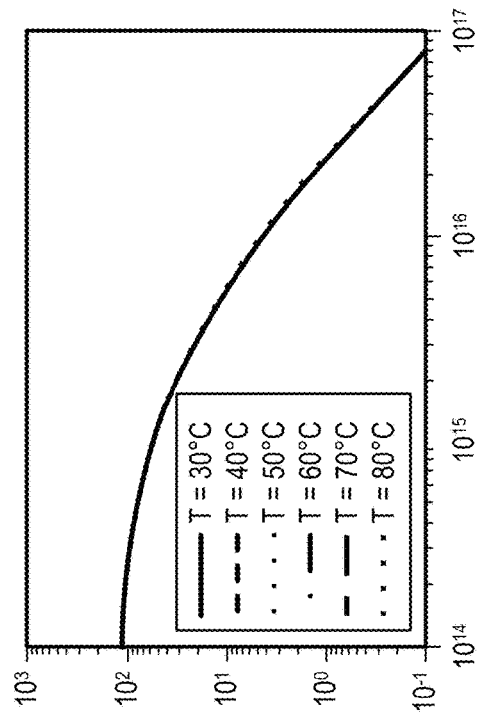
FIG. 5A
FIG. 5B
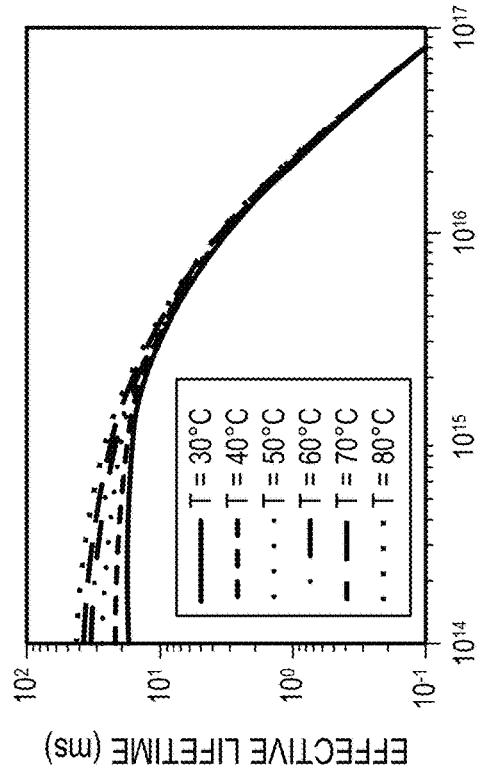
FIG. 5C
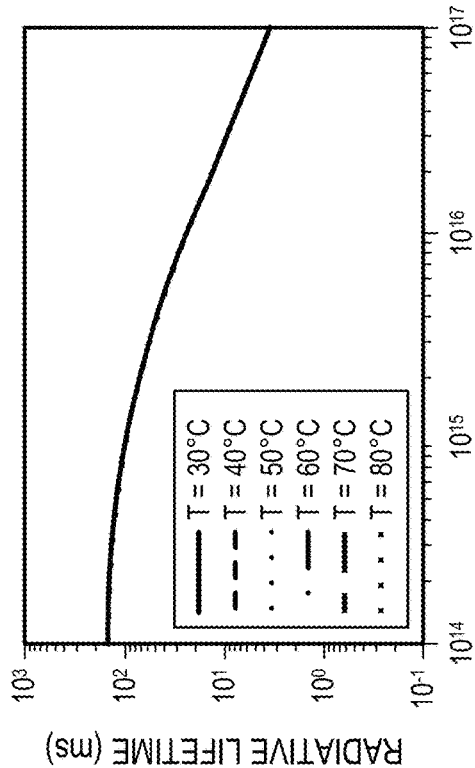
FIG. 5D

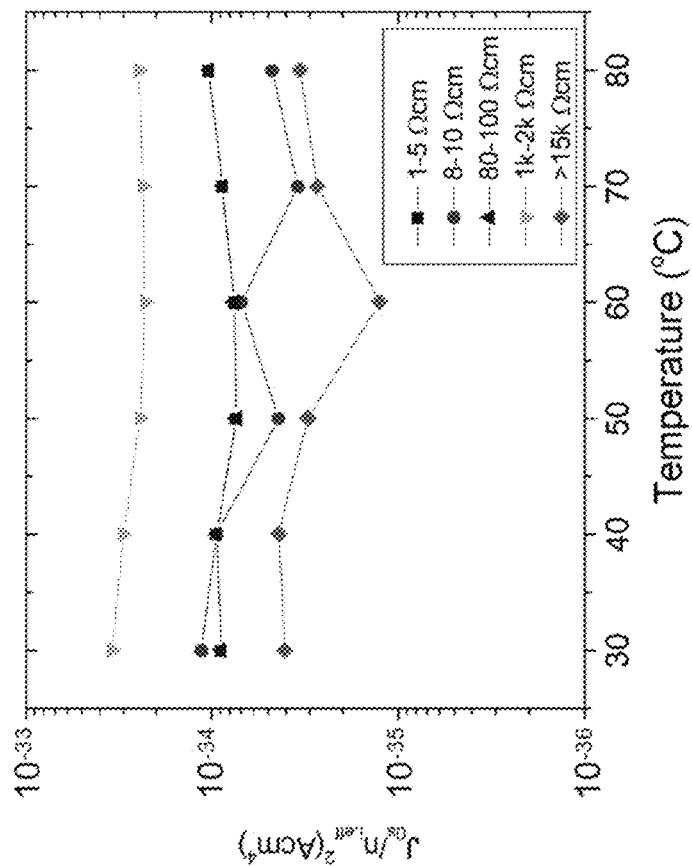
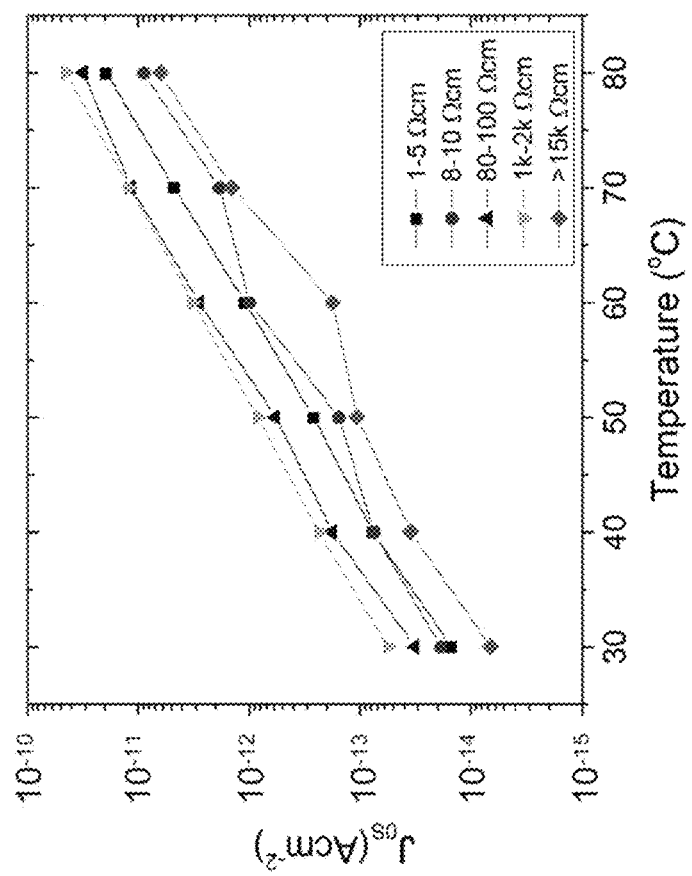
FIG. 13B
FIG. 13A

PHOTOVOLTAIC DEVICES WITH VERY HIGH BREAKDOWN VOLTAGES

RELATED APPLICATIONS

This application claims the benefit of provisional patent application Ser. No. 63/182,216, filed Apr. 30, 2021, the disclosure of which is hereby incorporated herein by reference in its entirety.

GOVERNMENT SUPPORT

This invention was made with government support under DE-EE0008549 awarded by the Department of Energy. The government has certain rights in the invention.

FIELD OF THE DISCLOSURE

The present disclosure relates to photovoltaic devices which have high breakdown voltages.

BACKGROUND

The photovoltaic (PV) community has debated the performance of n-type vs. p-type solar cells for many years but as high-efficiency solar cells move toward higher injection regimes, undoped (no-type) solar cells become an attractive option. Previous studies performed on high resistivity substrates (>>10 ohm centimeters ($\Omega$-cm)) are very limited in scope. There are numerical studies of devices but with little or no experimental component. These studies provide a first good insight of the device performance, but they do not demonstrate how the device would perform under real-world illumination intensity (0.1-1 suns) and temperature operation conditions (up to over 75 degrees Celsius (° C.)).

Solar cell parameters are normally reported at standard testing conditions (STC, 1000 watts per square meter (W/m$^2$), 25° C., AM1.5G spectrum). The encapsulated solar cell modules deployed in the field can reach operating temperatures as high as 75-90° C. Other studies focus more on the material properties showing how doping and impurity concentrations impact the bulk lifetime. Finally, there are studies that bridge both device and material properties, but the range of resistivities studied is very limited (1-10 $\Omega$-cm) and very far from the undoped regime (>>10 $\Omega$-cm), and again they do not address device performance under real-world operating conditions. None of the aforementioned studies demonstrate the reliability of real devices under real-world conditions.

SUMMARY

Photovoltaic devices with very high breakdown voltages are described herein. Typical commercial silicon photovoltaic devices have breakdown voltages below 50-100 volts (V). Even though such devices have bypass diodes to prevent photovoltaic cells from going into breakdown, the bypass diodes have high failure rates, leading to unreliable devices. A high-efficiency silicon photovoltaic cell is provided with very high breakdown voltages. By combining a device architecture with very low surface recombination and silicon wafers with high bulk resistivity (above 10 ohms centimeter ($\Omega$-cm)), embodiments described herein achieve breakdown voltages close to 1000 V. These photovoltaic cells with high breakdown voltages improve the reliability of photovoltaic devices, while reducing their design complexity and cost.

An exemplary embodiment provides a solar cell. The solar cell includes a semiconductor substrate having a bulk resistivity greater than 10 $\Omega$-cm; an n-type region over a first portion of the semiconductor substrate; and a p-type region over a second portion of the semiconductor substrate, wherein the n-type region and the p-type region form a heterojunction of the solar cell.

Another exemplary embodiment provides a method for providing a photovoltaic device. The method includes providing a semiconductor substrate having a bulk resistivity greater than 10 $\Omega$-cm; forming an n-type region over a first portion of the semiconductor substrate; and forming a p-type region over a second portion of the semiconductor substrate, wherein the n-type region and the p-type region form a heterojunction of a solar cell.

Another exemplary embodiment provides a photovoltaic device. The photovoltaic device includes a first output port; a second output port; and a first set of solar cells connected in series between the first output port and the second output port, wherein each of the first set of solar cells has a bulk resistivity greater than 10 $\Omega$-cm and a breakdown voltage greater than 200 V.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 5A is a graphical representation of effective lifetime as a function of the defect concentration at various temperatures.

FIG. 5B is a graphical representation of Auger lifetime as a function of the defect concentration at various temperatures.

FIG. 5C is a graphical representation of radiative lifetime as a function of the defect concentration at various temperatures.

FIG. 5D is a graphical representation of bulk SRH lifetime as a function of the defect concentration at various temperatures.

FIG. 13A is a graphical representation of surface saturation current density ($J_{0S}$) as a function of temperature for samples with different bulk resistivities.

FIG. 13B is a graphical representation of $J_{0S}/n_{i,eff}^2$ as a function of temperature for samples with different bulk resistivities.

DETAILED DESCRIPTION

Figure 1:
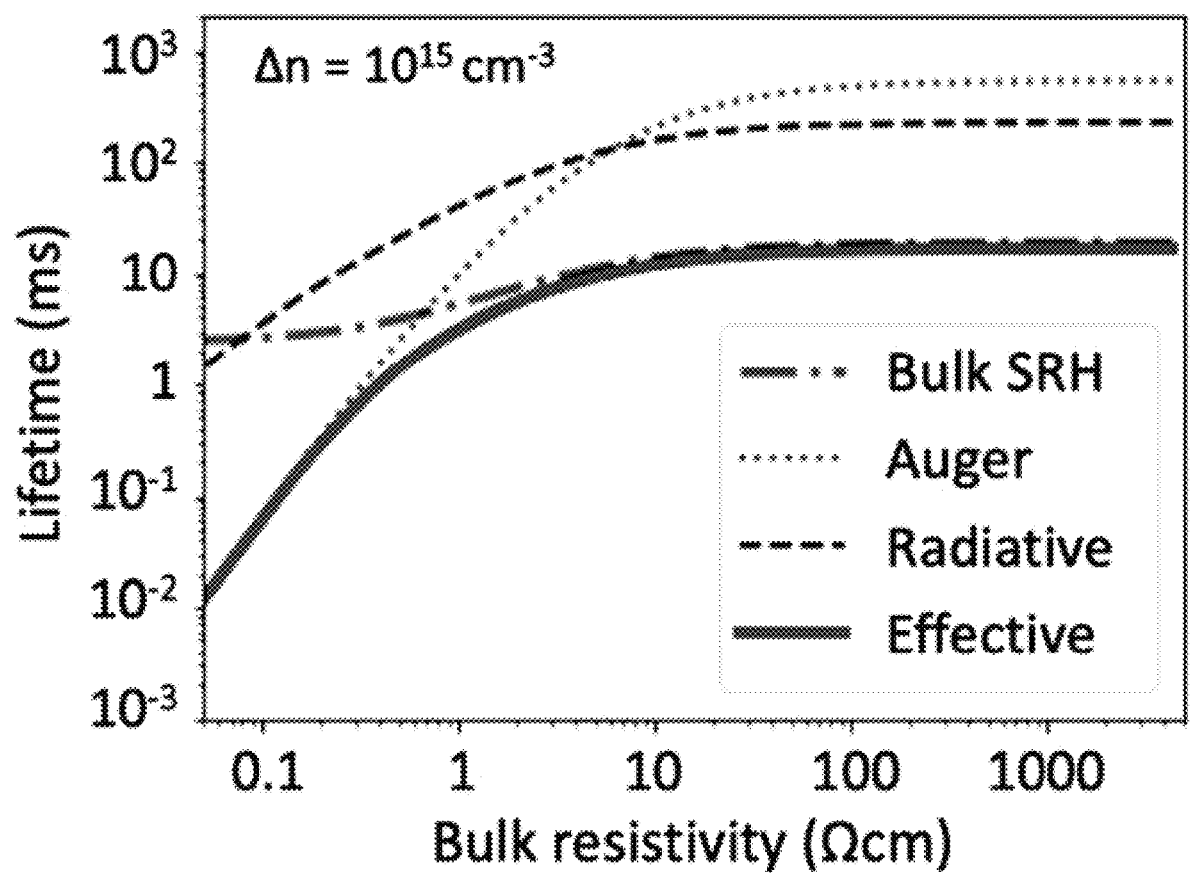
FIG. 1 is a graphical representation of simulated lifetimes at $10^{15}$ per cubic centimeter (cm$^{-3}$) as a function of bulk resistivity for a cobalt defect density of $10^9$ cm$^{-3}$ at 25 degrees Celsius (° C.).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Photovoltaic devices with very high breakdown voltages are described herein. Typical commercial silicon photovoltaic devices have breakdown voltages below 50-100 volts (V). Even though such devices have bypass diodes to prevent photovoltaic cells from going into breakdown, the bypass diodes have high failure rates, leading to unreliable devices. A high-efficiency silicon photovoltaic cell is provided with very high breakdown voltages. By combining a device architecture with very low surface recombination and silicon wafers with high bulk resistivity (above 10 ohms centimeter (Ω-cm)), embodiments described herein achieve breakdown voltages close to 1000 V. These photovoltaic cells with high breakdown voltages improve the reliability of photovoltaic devices, while reducing their design complexity and cost.

I. Introduction

Today's highest-efficiency silicon solar cells typically operate near a threshold between low-level and high-level injection. It is not well understood if pushing further into a regime in which the cell operating point is solidly in high-level injection at all times of the day has further benefits for the solar cell performance. From a reliability perspective, cells fabricated on lower doped silicon have a larger breakdown voltage. This advantage can affect the design of modules allowing higher voltages and a relaxation of the number of bypass diodes needed.

When a solar cell is operated in the reverse bias condition in dark, a very small drift current, called leakage current, flows due to minority carriers. Breakdown voltage for solar cell is the applied reverse dark voltage, exceeding which there is exponential increase in the leakage current. When the solar cells are connected in series in a module, shading in any part of the module can cause the shaded cell to go in reverse bias. Overheating resulting in fire can be caused by large breakdown current when the cell reaches breakdown. Even though typical modules have bypass diodes to prevent the cells going into breakdown, the bypass diodes have high failure rates. Thus, it is desirable to develop solar cells with high bulk resistivity to improve the reliability of photovoltaic modules, while reducing their design complexity and cost.

This disclosure presents a comprehensive assessment, both experimental and using simulation, of how bulk resistivity (or doping), light intensity, and operation temperature impact the performance and reliability of silicon solar cells and photovoltaic modules. Simulations were performed to understand the recombination kinetics of solar cells as a function of the bulk resistivity. This work incorporates a comprehensive device physics analysis assisted by numerical simulation. The simulation results indicate that high bulk resistivity wafers (>>10 Ω-cm) require bulk Shockley-Read-Hall (SRH) lifetimes in the millisecond range to outperform wafers with standard bulk resistivities (<10 Ω-cm). Additionally, above bulk resistivities of 10 Ω-cm (the exact value depends on the bulk characteristics of the wafer), the cell efficiency is weakly dependent on the bulk resistivity.

As a result, ingot manufactures may have an opportunity to further reduce wafer cost by growing higher resistivity ingots that are more tolerant to resistivity variations. This work is particularly relevant today, as solar cell architectures with improved surface passivation and milliseconds lifetimes wafers are commercially available, leveraging potential benefits of using higher bulk resistivities.

As a result of these simulations, it is shown that in order to accomplish high conversion efficiencies (e.g., >20%), a solar cell structure is needed that is carrier injection independent of the bulk wafer doping on solar cells using high resistivity wafers (above 10 Ω-cm). To be carrier injection independent from the bulk doping, a solar cell needs to operate at higher injections, and good surface passivation is critical to accomplish that. An exemplary embodiment used a passivated contact solar cell architecture to achieve very good surface passivation. There are different solar cell structures that can accomplish the level of surface passivation needed. Evaluations were carried out using deposited intrinsic and doped layers of hydrogenated amorphous silicon on top of crystalline silicon wafers forming a p-n junction, and delivering adequate surface passivation.

For the evaluations, solar cells with bulk resistivities in the range of 1 Ω-cm to >15 k Ω-cm were manufactured and characterized. Under standard testing conditions (STC), solar cells efficiencies over 20% were measured over the entire range of bulk resistivities, using the baseline cell processing described herein. To evaluate the cell performance in real-world operation conditions, the solar cells were measured at different temperatures (25-80° C.) and at different light intensities (0.1-1 suns). The measurements show that the bulk resistivity does not impact the solar cell response to temperature and light intensity. Similar thermal coefficients (TC) were measured for standard and high bulk resistivities, and they are comparable with the TC values reported in the literature for standard bulk resistivities<10 Ω-cm.

After light soaking, the solar cell did not show signs of light-induced degradation (LID). This result was expected since n-type float zone (FZ) wafers were used in this work, i.e., low traces of boron and low concentration of oxygen (oxygen is typically found in the seed end of Czochralski (CZ) ingots). For high bulk resistivities (>10 Ω-cm), extremely high breakdown voltages (>1000 V) were measured. Accordingly, embodiments of the present disclosure improve the levelized cost of energy (LCOE) of photovoltaic systems through their effect on cell and ingot manufacturing yield, silicon cell power output, and module reliability.

II. Simulation Results and Capabilities

This section summarizes the main results and capabilities of the simulation code developed for this disclosure. The code is written in the free open-source programming language Python. It is available at the open-source repository Github: https://github.com/pvedu/low_doping/. To better understand the recombination processes, the effective minority carrier lifetime was broken down into its component parts. The Auger and radiative recombination were calculated using Richter's parametrization, which includes the Schenk's bandgap narrowing model and injection dependent radiative recombination. The bulk Shockley-Read-Hall (SRH) recombination was calculated using a temperature dependent SRH model. The surface recombination was evaluated using the surface saturation current density ($J_{0S}$).

FIG. 1 is a graphical representation of simulated lifetimes at $10^{15}$ per cubic centimeter ($cm^{-3}$) (near the maximum power) as a function of bulk resistivity for a cobalt defect density of $10^9$ $cm^{-3}$ at 25° C. The surface was assumed to be perfectly passivated (i.e., $J_{0S}$=0 femtoamps per square centimeter ($fA/cm^2$)). According to the simulation model developed herein, for a given defect and defect density, the lifetime initially increases with increasing bulk resistivity and then plateaus for bulk resistivities over 10 Ω-cm, as shown in FIG. 1. The exact value of bulk resistivity for the lifetime plateau depends on the bulk characteristics of the wafer. The same trend is seen for efficiency and other current-voltage (I-V) parameters.

Figures 2A, 2B, 2C:
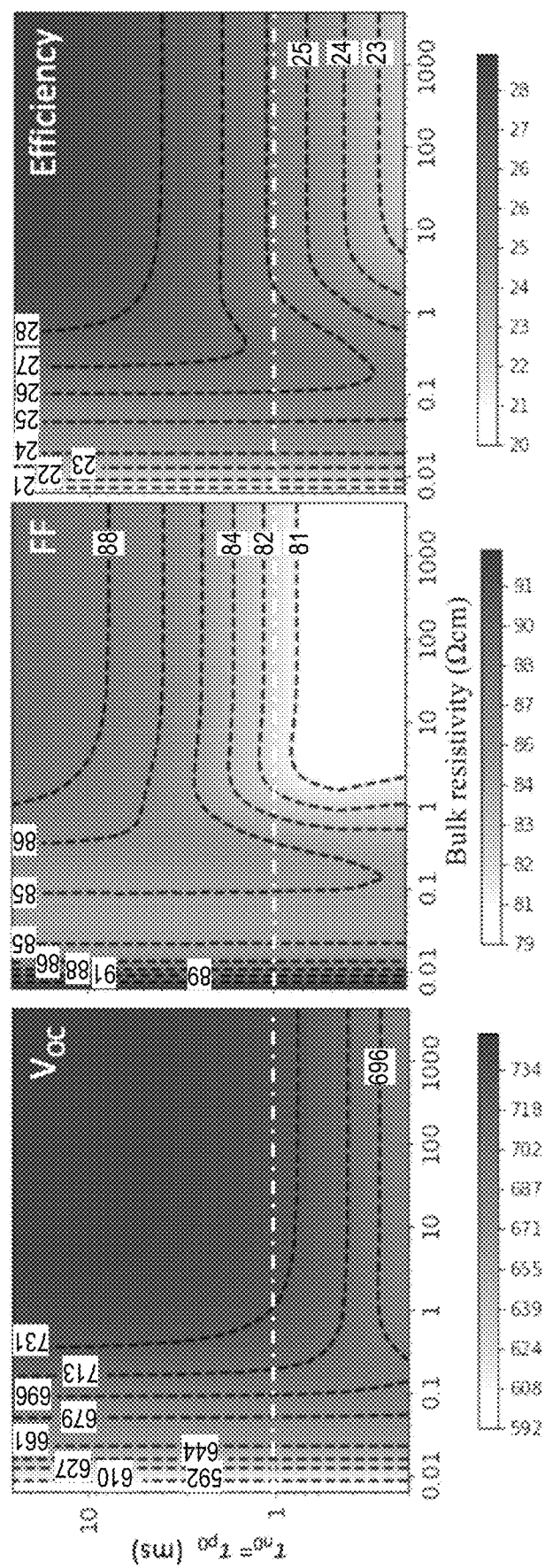
FIG. 2A is a graphical representation of open circuit voltage ($V_{OC}$) as a function of bulk resistivity and bulk Shockley-Read-Hall (SRH) lifetime parameters $\tau_{n0}$ and $\tau_{p0}$.
FIG. 2B is a graphical representation of fill-factor (FF) as a function of bulk resistivity and bulk SRH lifetime parameters $\tau_{n0}$ and $\tau_{p0}$.
FIG. 2C is a graphical representation of efficiency as a function of bulk resistivity and bulk SRH lifetime parameters $\tau_{n0}$ and $\tau_{p0}$.

FIG. 2A is a graphical representation of open circuit voltage ($V_{OC}$) as a function of bulk resistivity and bulk SRH lifetime parameters $\tau_{n0}$ and $\tau_{p0}$. FIG. 2B is a graphical representation of fill-factor (FF) as a function of bulk resistivity and bulk SRH lifetime parameters $\tau_{n0}$ and $\tau_{p0}$. FIG. 2C is a graphical representation of efficiency as a function of bulk resistivity and bulk SRH lifetime parameters $\tau_{n0}$ and $\tau_{p0}$. Here, a substrate thickness of 180 microns (μm), perfectly passivated surface, and temperature of 25° C. were assumed.

FIGS. 2A-2C show how the implied I-V parameters vary with the bulk resistivity and the bulk SRH lifetime when a mid-bandgap defect with the same electron and hole lifetimes ($\tau_{n0}=\tau_{p0}$) is assumed. At lower bulk lifetimes, i.e., $\tau_{n0}=\tau_{p0}<1$ ms (white dashed line), the FF and efficiency benefit from the lower bulk resistivities. Higher bulk resistivities require higher bulk SRH lifetimes to outperform standard bulk resistivities (<10 Ω-cm). The voltage is the product of the base doping and the excess carrier density (or injection level). When a lower doped material is used (i.e., higher resistivity wafer), a solar cell needs to operate at higher injection levels (i.e., higher excess carrier density) to outperform higher doped materials (lower resistivity wafers). Longer lifetimes are required to operate at higher injections. The voltage gains or losses are translated in FF and efficiency gains or losses as well.

Figure 3:
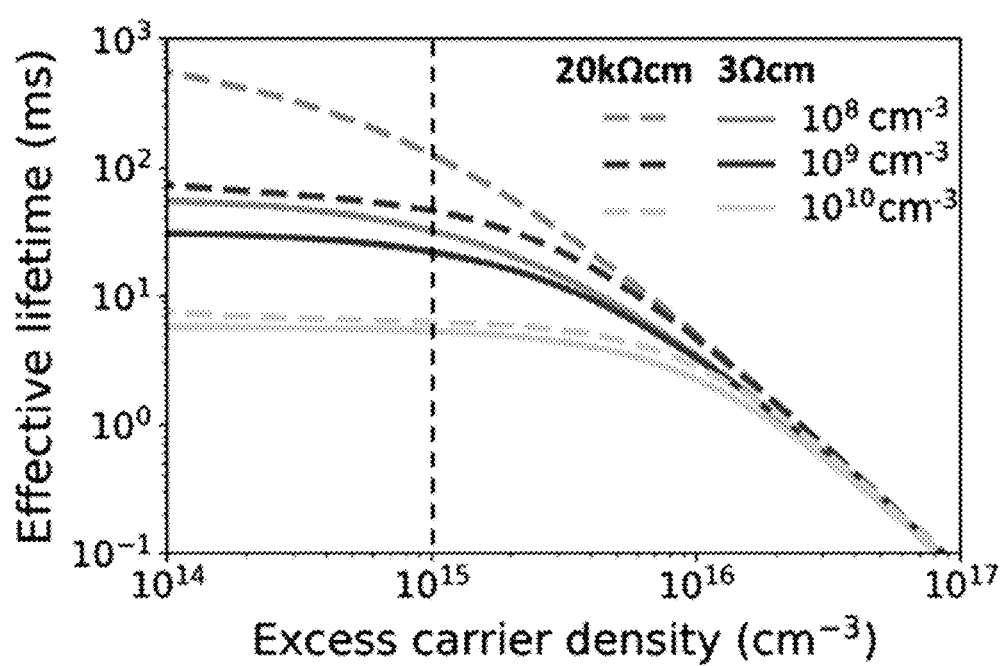
FIG. 3 is a graphical representation of effective lifetimes for 3 ohms centimeter ($\Omega$-cm) and 20 k $\Omega$-cm 180 micron (µm) wafers as a function of the defect concentration.

FIG. 3 is a graphical representation of effective lifetimes for 3 Ω-cm and 20 k Ω-cm 180 μm wafers as a function of the defect concentration. The defect used is zinc (Zn), with $E_C-E_T$=0.84 electron volts (eV), $\sigma_n$=9.9×$10^{-16}$ per centimeter ($cm^{-2}$), $\sigma_p$=2×$10^{-14}$ $cm^{-2}$, and temperature of 25° C. (where $E_C$ is the energy level of the conduction band, $E_T$ is the energy level of the defect, and $\sigma_n$ and $\sigma_p$ are the defect cross section for electrons and holes). It is important to note that wafers with lower doping concentrations (higher bulk resistivity) normally have longer lifetime than wafers with higher doping concentrations (lower bulk resistivity).

Figure 4B:
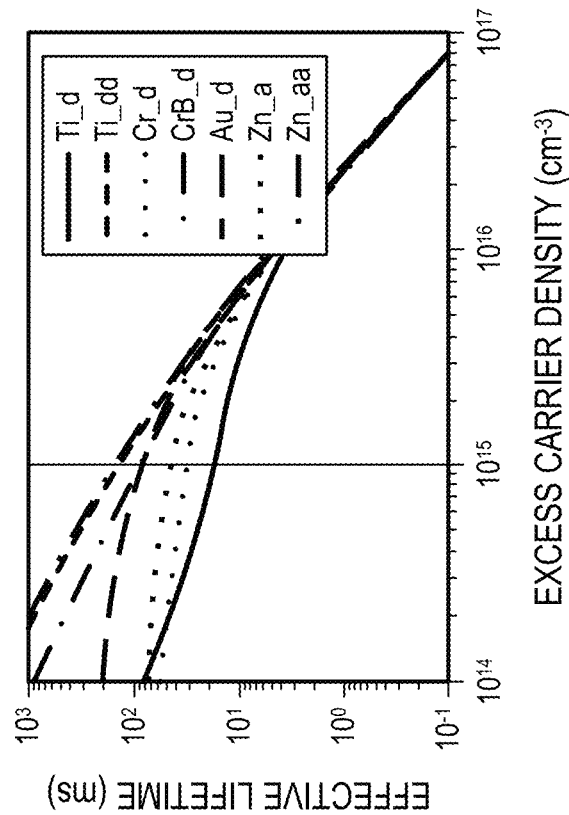
FIG. 4B is a graphical representation of effective lifetimes for a 20 k $\Omega$-cm bulk resistivity 180 µm wafer when defect types are varied with defect concentration of $10^9$ cm$^{-3}$ at 25° C.
Figure 4A:
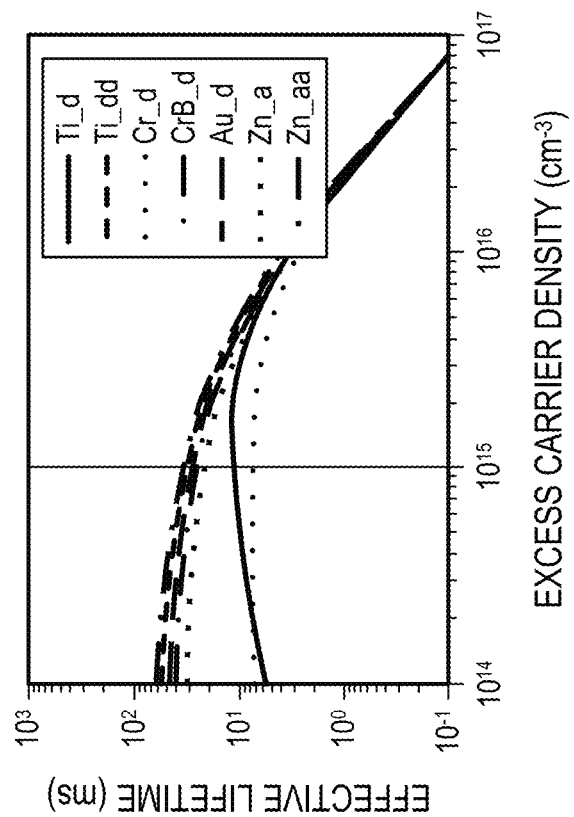
FIG. 4A is a graphical representation of effective lifetimes for a 3 $\Omega$-cm bulk resistivity 180 µm wafer when defect types are varied with defect concentration of $10^9$ cm$^{-3}$ at 25° C.

FIG. 4A is a graphical representation of effective lifetimes for a 3 Ω-cm bulk resistivity 180 μm wafer when defect types are varied with defect concentration of $10^9$ $cm^{-3}$ at 25° C. FIG. 4B is a graphical representation of effective lifetimes for a 20 k Ω-cm bulk resistivity 180 μm wafer when defect types are varied with defect concentration of $10^9$ $cm^{-3}$ at 25° C. Defects simulated include titanium (Ti), chromium (Cr), boron (B), and gold (Au). FIGS. 4A and 4B show, for standard and high resistivity wafers respectively, how different defects impact lifetime. Again, high resistivity wafers outperform lower resistivity wafers, regardless of the defect type. The dashed line in FIGS. 4A and 4B represent approximately the excess carrier density (injection level) of the maximum power.

Figure 5E:
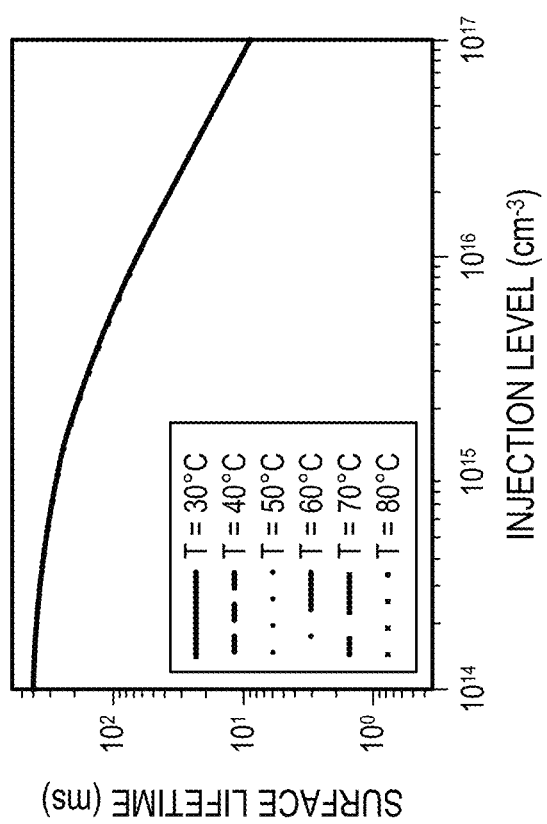
FIG. 5E is a graphical representation of surface lifetime as a function of the defect concentration at various temperatures.

FIGS. 5A-5E illustrate an example of how the different components of the effective lifetimes are affected by temperature. FIG. 5A is a graphical representation of effective lifetime as a function of the defect concentration at various temperatures. FIG. 5B is a graphical representation of Auger lifetime as a function of the defect concentration at various temperatures. FIG. 5C is a graphical representation of radiative lifetime as a function of the defect concentration at various temperatures. FIG. 5D is a graphical representation of bulk SRH lifetime as a function of the defect concentration at various temperatures. FIG. 5E is a graphical representation of surface lifetime as a function of the defect concentration at various temperatures.

Figure 6B:
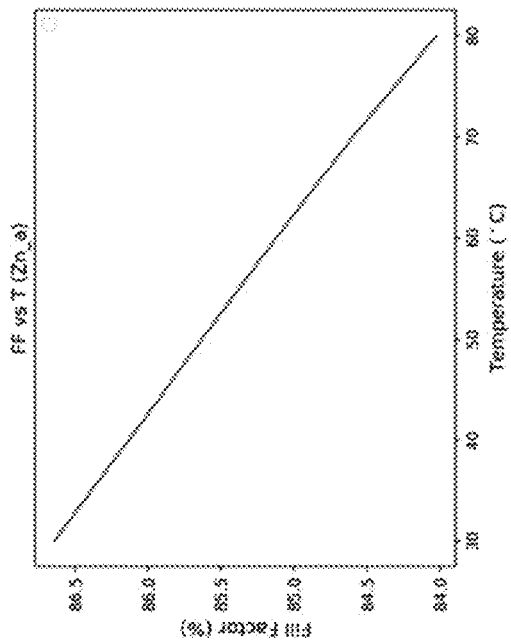
FIG. 6B is a graphical representation of FF as a function of temperature.
Figure 6D:
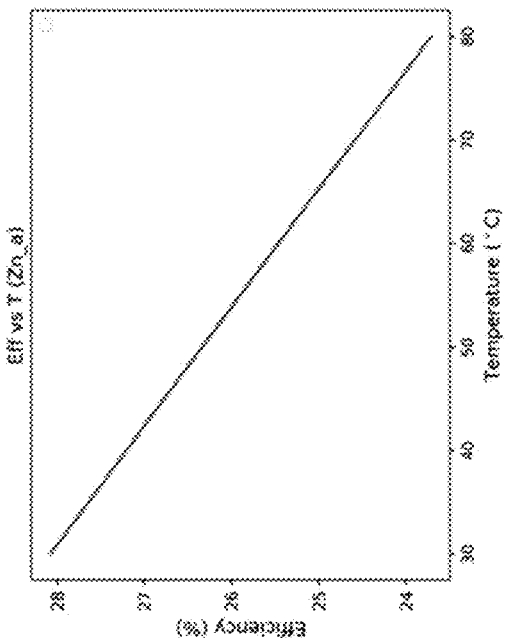
FIG. 6D is a graphical representation of efficiency as a function of temperature.
Figure 6A:
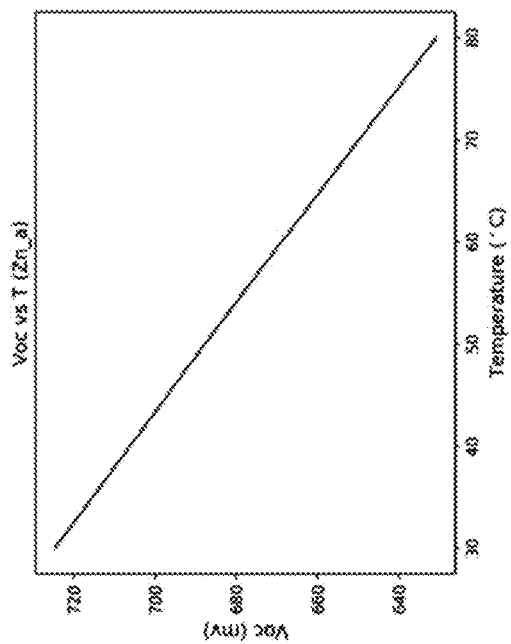
FIG. 6A is a graphical representation of $V_{OC}$ as a function of temperature.
Figure 6C:
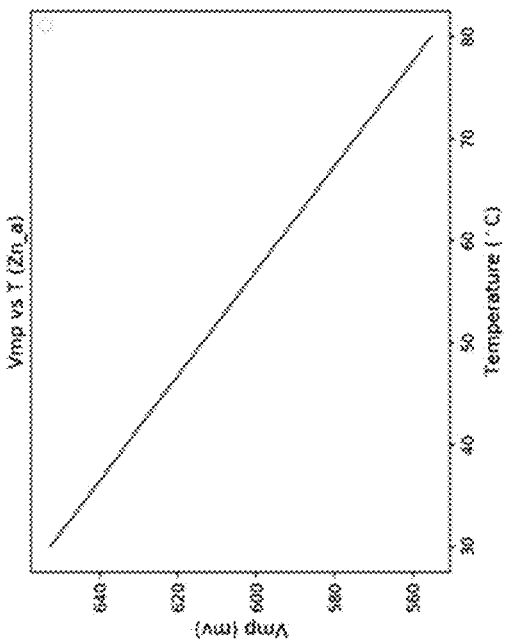
FIG. 6C is a graphical representation of voltage at maximum power ($V_{MP}$) as a function of temperature.

FIGS. 6A-6D illustrate an example of how the implied I-V parameters are impacted by temperature. FIG. 6A is a graphical representation of $V_{OC}$ as a function of temperature. FIG. 6B is a graphical representation of FF as a function of temperature. FIG. 6C is a graphical representation of voltage at maximum power ($V_{MP}$) as a function of temperature. FIG. 6D is a graphical representation of efficiency as a function of temperature. The defect is Zn and $E_C-E_T=0.84$ eV.

The capture cross-sections are temperature dependent. The model used herein takes into account the capture cross-section for the different temperatures. Regarding the lifetime's components in FIGS. 5A-5E, it is visible that only bulk SRH lifetime seems to vary with temperature. Depending on the defect type, the bulk SRH lifetime can increase or decrease with temperature. FIGS. 6A-6D show that all the implied I-V parameters decrease with temperature. The increase of the effective lifetime (FIG. 5A) and the increase of the effective intrinsic carrier concentration ($n_{i,eff}$) with temperature seems to not compensate the bandgap narrowing with temperature. This trend was verified experimentally for different bulk resistivities (see FIGS. 7A-7D), where higher effective lifetimes did not translate in higher I-V parameters as temperature increases.

Figure 7A:
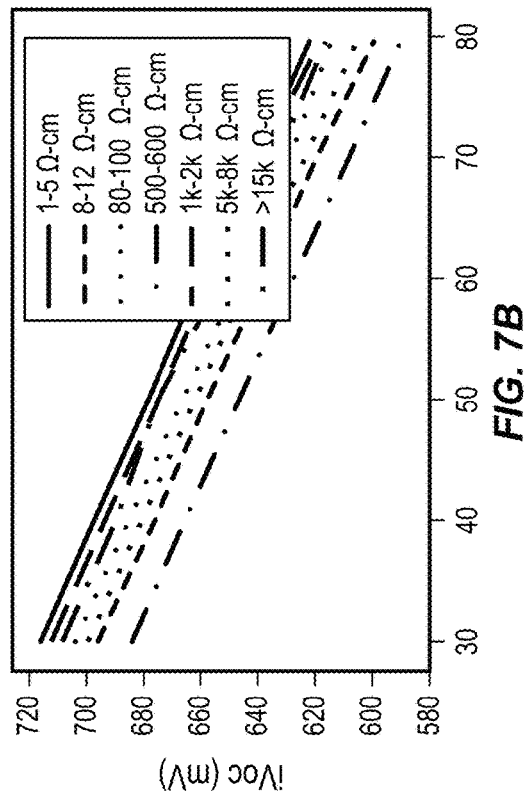
FIG. 7A is a graphical representation of effective lifetime as a function of temperature.
Figure 7B:
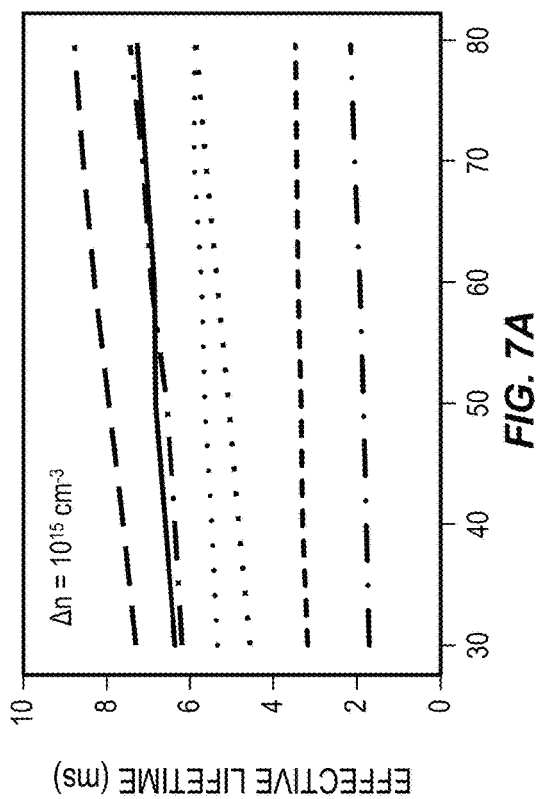
FIG. 7B is a graphical representation of implied $V_{OC}$ ($iV_{OC}$) as a function of temperature.
Figure 7C:
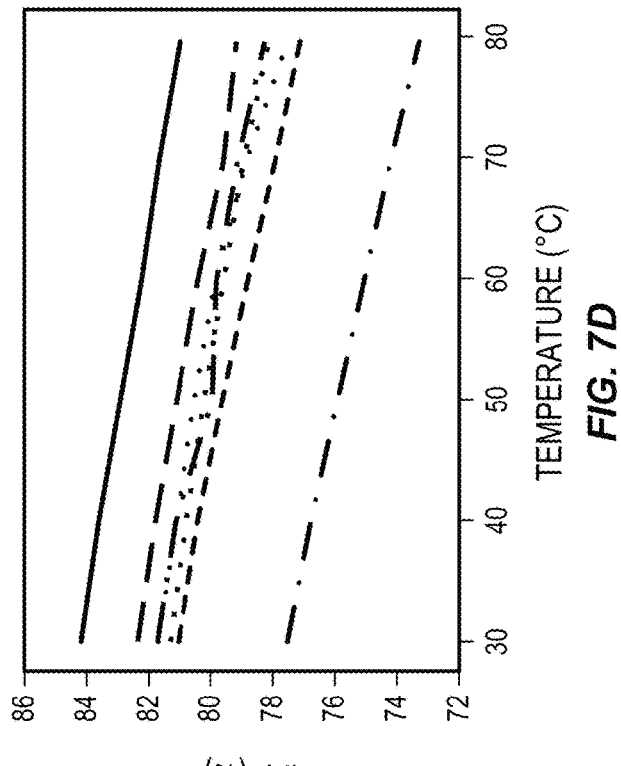
FIG. 7C is a graphical representation of implied $V_{MP}$ ($iV_{MP}$) as a function of temperature.
Figure 7D:
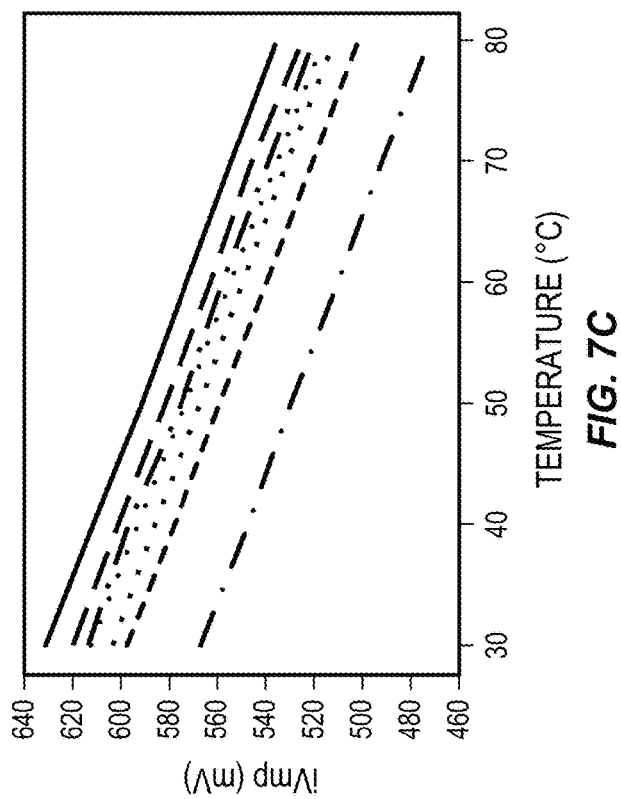
FIG. 7D is a graphical representation of implied FF (iFF) as a function of temperature.

FIGS. 7A-7D illustrate temperature dependence of effective lifetime and implied I-V parameters for wafers with bulk resistivity between 1 Ω-cm and >15 k Ω-cm. FIG. 7A is a graphical representation of effective lifetime as a function of temperature. FIG. 7B is a graphical representation of implied $V_{OC}$ ($iV_{OC}$) as a function of temperature. FIG. 7C is a graphical representation of implied $V_{MP}$ ($iV_{MP}$) as a function of temperature. FIG. 7D is a graphical representation of implied FF (iFF) as a function of temperature.

Looking with more detail to FIGS. 7A-7D, the wafers with bulk resistivities of 1-5 Ω-cm and >15 k Ω-cm have very similar lifetimes. Again, in principle, the higher resistivity wafer should have a higher lifetime, but this is only true if the defect concentration on those wafers is exactly the same. This case is also useful to demonstrate experimentally what the simulation predicted in FIG. 2. Having similar lifetimes, the wafer with lower resistivity outperforms the wafer with high resistivity due to reasons previously addressed.

In conclusion, the simulation results (validated in part by experimental data) show that wafers with high resistivity are less sensitive to defects. Higher lifetimes are required for high resistivity wafers to outperform standard wafers. Although in many cases lifetime increases with temperature, this effect seems to not compensate the bandgap narrowing with temperature, leading to lower voltages, FF and efficiencies.

The results also show that, after a certain bulk resistivity, the lifetime (and efficiency) initially increases with increasing of the bulk resistivity and then plateaus for bulk resistivities over 10 Ω-cm. The exact value of bulk resistivity from which the lifetime (and efficiency) plateaus depends on the specific bulk characteristics of the wafer. As a result, ingot manufacturers may have an opportunity to further reduce cost by growing higher resistivity ingots that are more tolerant to resistivity variations.

III. High Resistivity Solar Cell and Photovoltaic Device

Figure 8A:
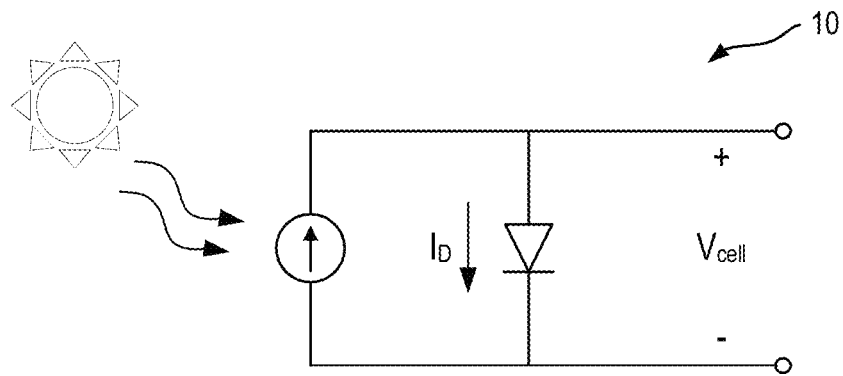
FIG. 8A is a schematic diagram of a high resistivity solar cell according to embodiments described herein.

FIG. 8A is a schematic diagram of a high resistivity solar cell 10 according to embodiments described herein. In an exemplary aspect, the solar cell 10 is produced on an undoped or low doped (e.g., n-type or p-type) semiconductor substrate (e.g., crystalline silicon). In some examples, the solar cell 10 is produced on a compensated doped wafer (e.g., having n- and p-type dopants such that the wafer functions similar to an undoped or low doped wafer). The solar cell 10 achieves high efficiency (e.g., >20%) with a high bulk resistivity over 10 Ω-cm and bulk SRH lifetimes in the millisecond range. In addition, the structure of the solar cell 10 is carrier injection independent of the bulk wafer doping, and therefore the solar cell 10 operates at higher injections facilitated by good surface passivation. An exemplary embodiment uses a passivated contact solar cell architecture to achieve very good surface passivation. It should be understood that other embodiments may accomplish the surface passivation differently. Further details of the solar cell structure are described in Section IV below.

Figure 8B:
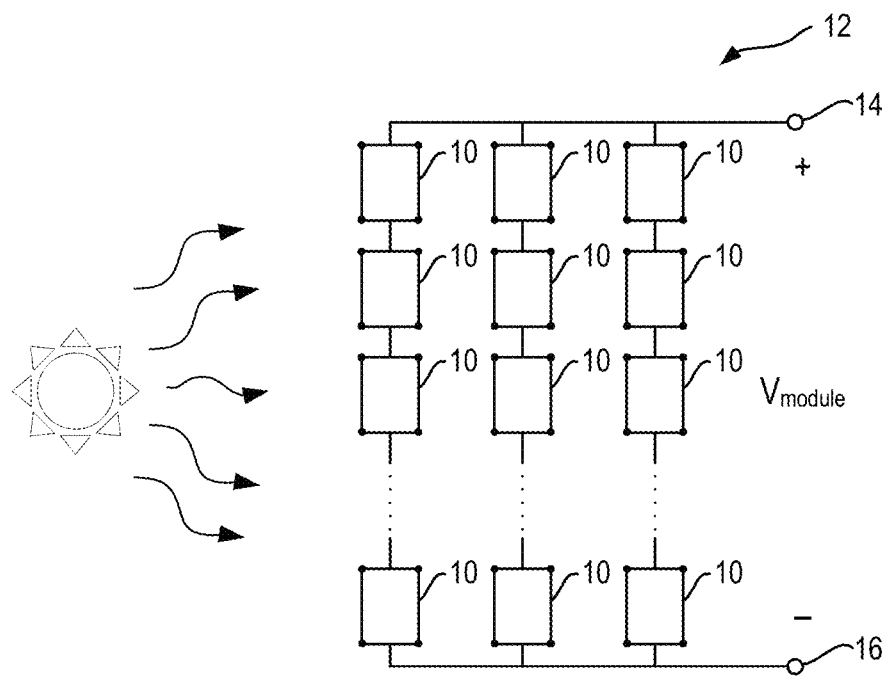
FIG. 8B is a schematic diagram of a photovoltaic device incorporating an array of high resistivity solar cells.

FIG. 8B is a schematic diagram of a photovoltaic device 12 incorporating an array of high resistivity solar cells 10. In this regard, the photovoltaic device includes one or more sets of solar cells 10 connected in series between a first output port 14 and a second output port 16 (where a module voltage $V_{module}$ can be defined across the first output port 14 and the second output port 16). Due to the high resistivity of the solar cells 10, the photovoltaic device 12 has improved reliability (e.g., due to very high breakdown voltages above 200 V) and lower design cost and complexity from traditional solar arrays.

IV. Evaluation Results

This section summarizes the evaluation results. To study the impact of temperature and illumination intensity on solar cells with different bulk resistivities, lifetime test samples and silicon heterojunction solar cells were manufactured using Float Zone (FZ) phosphorous doped n-type wafers with <100> orientation, thicknesses of 400 μm and 200 μm and bulk resistivities between 1 Ω-cm and >15 k Ω-cm. The use of FZ wafers is exemplary in nature, and other embodiments can use other wafers (e.g., CZ wafers) with very high bulk resistivities (e.g., >100 Ω-cm).

Figure 9A:
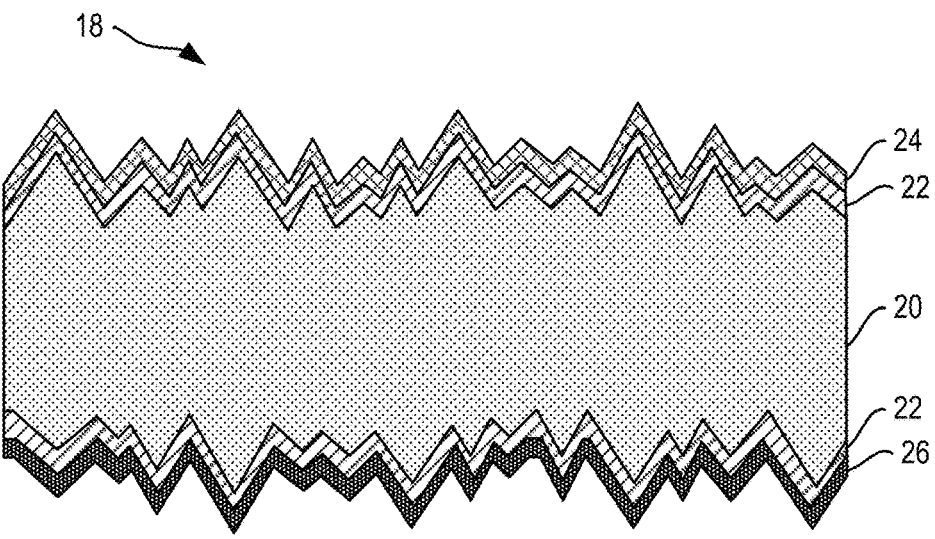
FIG. 9A is a schematic diagram of a lifetime test sample structure used for the evaluation.

FIG. 9A is a schematic diagram of a lifetime test sample 18 structure used for the evaluation. The lifetime test sample 18 in an exemplary embodiment is an n-type FZ wafer with a high bulk resistivity. The lifetime test sample 18 includes a semiconductor substrate 20, which may be a crystalline silicon substrate that is undoped or lightly doped (e.g., with a doping concentration<$10^{15}$ cm$^{-3}$). Intrinsic hydrogenated amorphous silicon layers 22 are deposited on both major surfaces of the semiconductor substrate 20. A p-doped hydrogenated amorphous silicon layer 24 is deposited over one of the intrinsic hydrogenated amorphous silicon layers 22 and an n-doped hydrogenated amorphous silicon layer 26 is deposited over the opposite intrinsic hydrogenated amorphous silicon layer 22 to form a p-n junction.

Figure 9B:
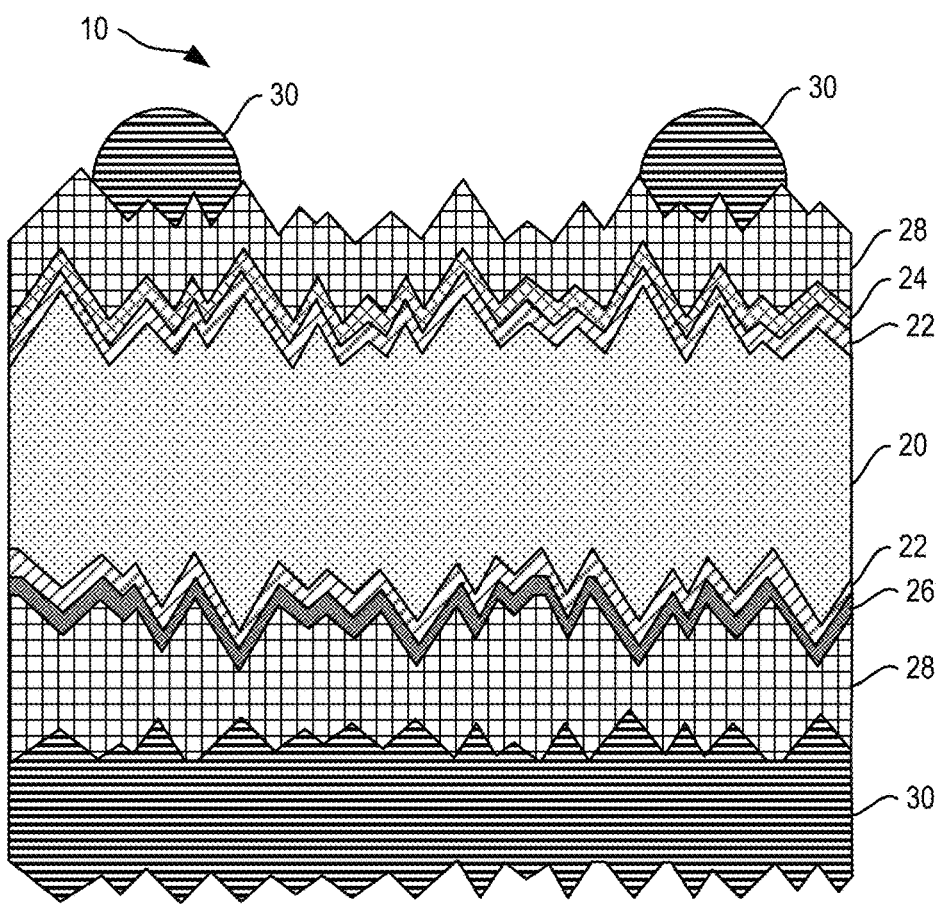
FIG. 9B is a schematic diagram of a silicon heterojunction solar cell structure used for the evaluation.

FIG. 9B is a schematic diagram of a silicon heterojunction solar cell structure used for the evaluation. As testbed, silicon solar cells 10 were manufactured on n-type silicon wafers (e.g., semiconductor substrate 20) with a large range of bulk resistivities (1 Ω-cm to >15 k Ω-cm). Silicon heterojunction was selected as the testbed architecture because of its excellent surface passivation properties and the low temperature budget of the manufacturing processes, minimizing possible changes in the bulk properties during the cell processing. It should be understood that other embodiments of the solar cells 10 described herein may have a different architecture.

Intrinsic hydrogenated amorphous silicon layers 22, as well as a p-doped hydrogenated amorphous silicon layer 24 and an n-doped hydrogenated amorphous silicon layer 26 were deposited on top of the silicon wafers forming a p-n junction. Transparent conductive layers 28 (e.g., indium tin oxide (ITO)) were deposited over each of the p-doped hydrogenated amorphous silicon layer 24 and the n-doped hydrogenated amorphous silicon layer 26. Conductive contacts can be deposited over the conductive layers 28, such as by screen-printing (e.g., as shown as the top conductive contacts 30), sputtering (e.g., as shown as the bottom conductive contacts 30), vapor deposition, or another appropriate technique. The conductive contacts 30 can be formed of silver, gold, aluminum, another metal, or alloys thereof.

This structure delivers adequate surface passivation, carrier selectivity, and high shunt resistance. A structure with different layers could potentially be used if they provide sufficient surface passivation, carrier selectivity, and good shunt resistance (e.g., oxide-based layers for surface passivation layers).

Performance of the test solar cells was measured under real-world temperature (25-80° C.) and illumination intensity (0.1-1 suns) operation conditions. Thermal coefficients (TC) were measured, demonstrating that the bulk resistivity does not impact the TC of the cells. The measured TC are comparable with values previously reported on solar cells with standard bulk resistivities<10 Ω-cm. Light soaking and breakdown voltages measurements were also performed.

A. Current-Voltage Characteristics

Figure 10:
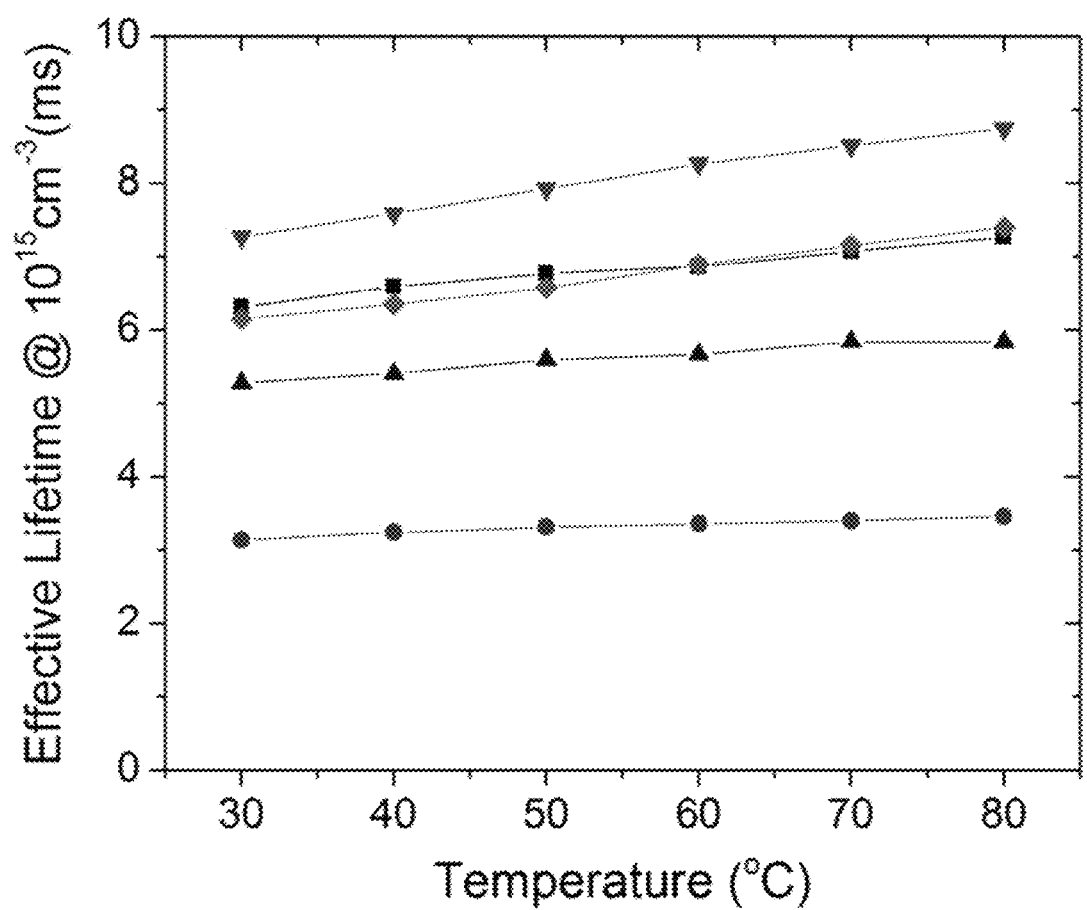
FIG. 10 is a graphical representation of effective lifetime measured at different temperatures of samples with different bulk resistivities.

FIG. 10 is a graphical representation of effective lifetime measured at different temperatures of samples with different bulk resistivities. The values presented were measured at $10^{15}$ cm$^{-3}$ excess carrier density. As predicted in the simulation section, the effective lifetime increases slightly with temperature. This increase in lifetime is not translated in increase of the implied parameters (see FIGS. 11A and 11B).

Figure 11B:
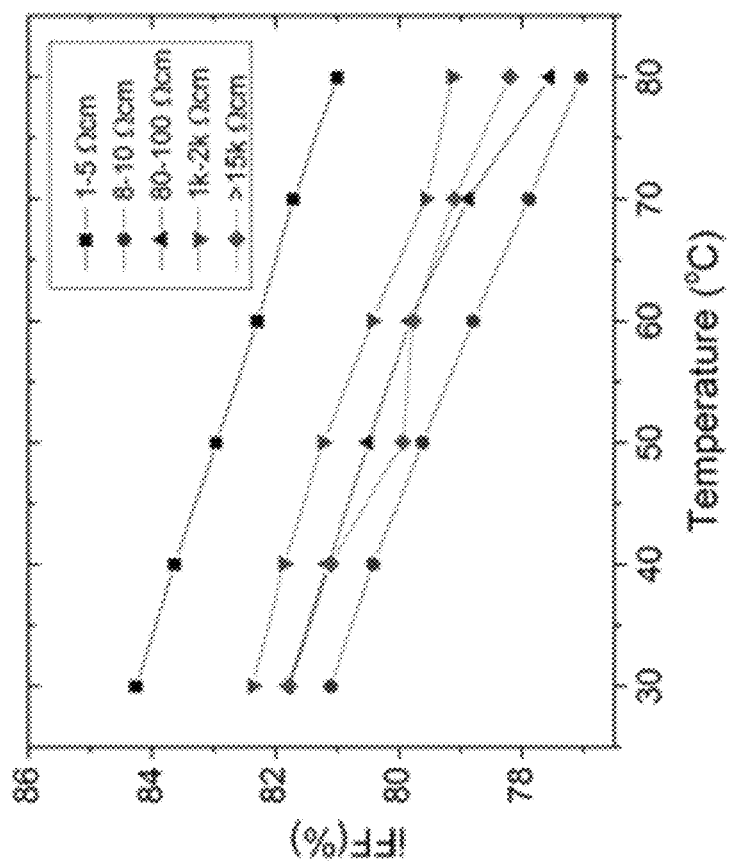
FIG. 11B is a graphical representation of iFF extracted from the effective lifetime measured at different temperatures for samples with different bulk resistivities.
Figure 11A:
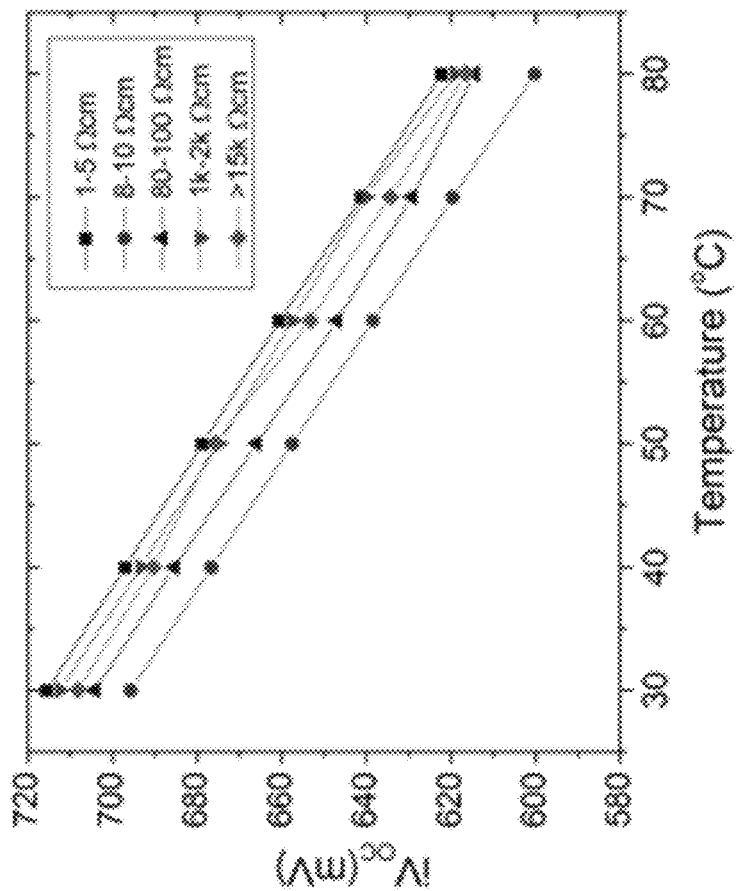
FIG. 11A is a graphical representation of $iV_{OC}$ extracted from the effective lifetime measured at different temperatures for samples with different bulk resistivities.
Figure 12:
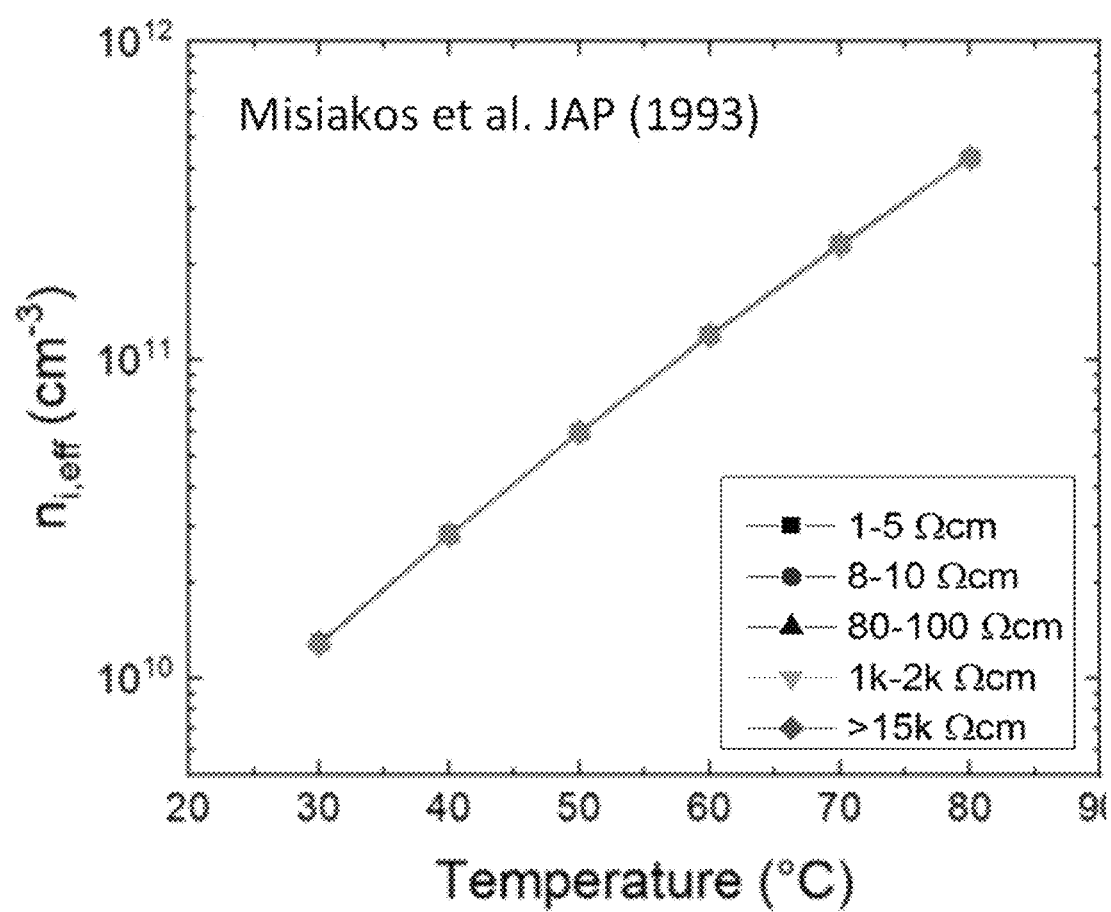
FIG. 12 is a graphical representation of effective intrinsic carrier concentration ($n_{i,eff}$) as a function of temperature.

FIG. 11A is a graphical representation of $iV_{OC}$ extracted from the effective lifetime measured at different temperatures for samples with different bulk resistivities. FIG. 11B is a graphical representation of iFF extracted from the effective lifetime measured at different temperatures for samples with different bulk resistivities. FIG. 12 is a graphical representation of $n_{i,eff}$ as a function of temperature. In FIGS. 11A and 11B, the implied I-V parameters decrease with temperature for all bulk resistivities, indicating the increase in effective lifetime and effective intrinsic carrier concentration ($n_{i,eff}$, FIG. 12) does not compensate the bandgap narrowing with temperature. These results are in agreement with the simulation results.

FIG. 13A is a graphical representation of $J_{OS}$ as a function of temperature for samples with different bulk resistivities. FIG. 13B is a graphical representation of $J_{OS}/n_{i,eff}^2$ as a function of temperature for samples with different bulk resistivities. FIG. 13A shows that $J_{OS}$ increases by several orders of magnitude with temperature for all bulk resistivities. This large increase with temperature can be explained by the increase of the effective intrinsic carrier concentration. As seen in FIG. 13B, when the $J_{OS}$ is divided by $n_{i,eff}^2$, nearly flat lines are obtained.

Figure 14:
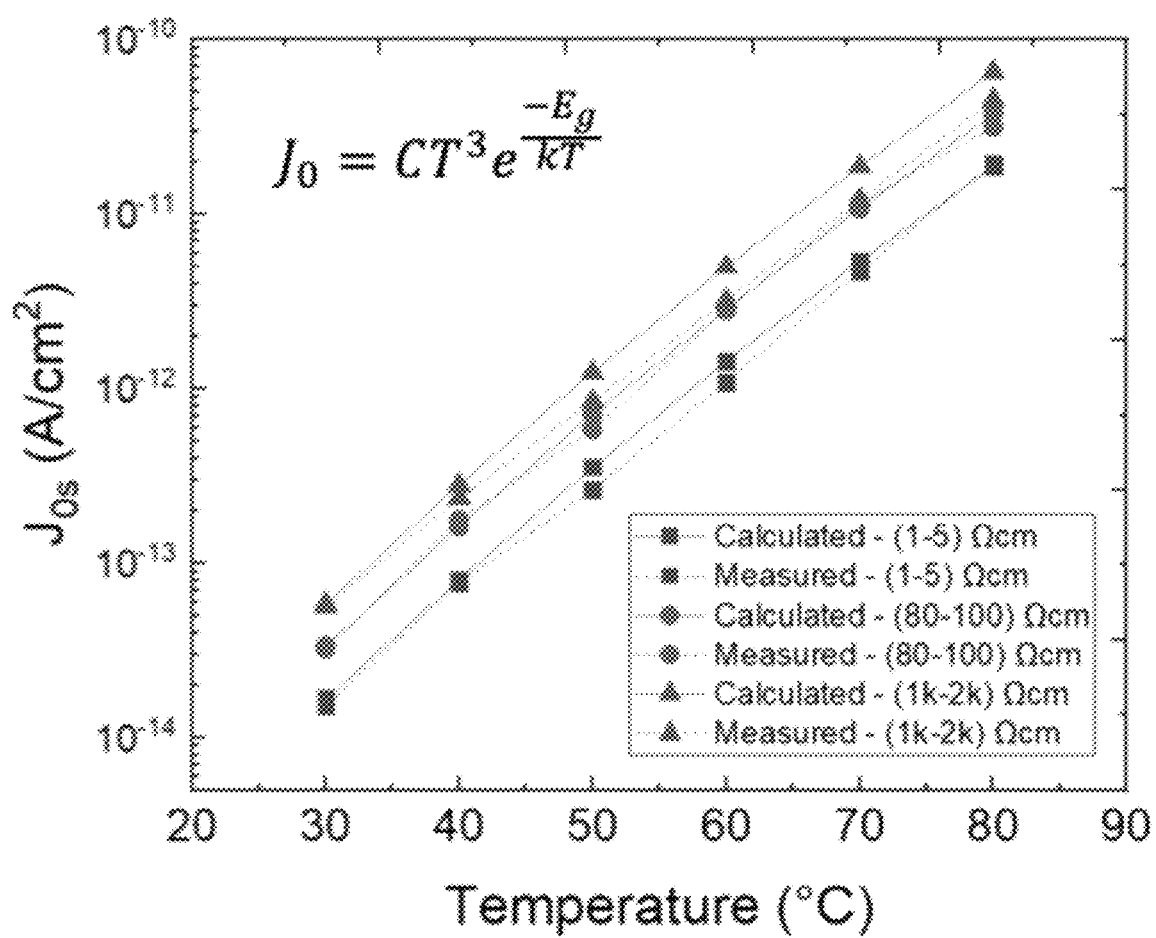
FIG. 14 is a graphical representation of $J_{0S}$ measured and calculated for samples with different bulk resistivities and temperatures.

FIG. 14 is a graphical representation of $J_{OS}$ measured and calculated for samples with different bulk resistivities and temperatures. This shows that the measured $J_{OS}$ has a cubic dependence with temperature. This dependence was previously reported on standard bulk resistivities wafers.

Figure 15A:
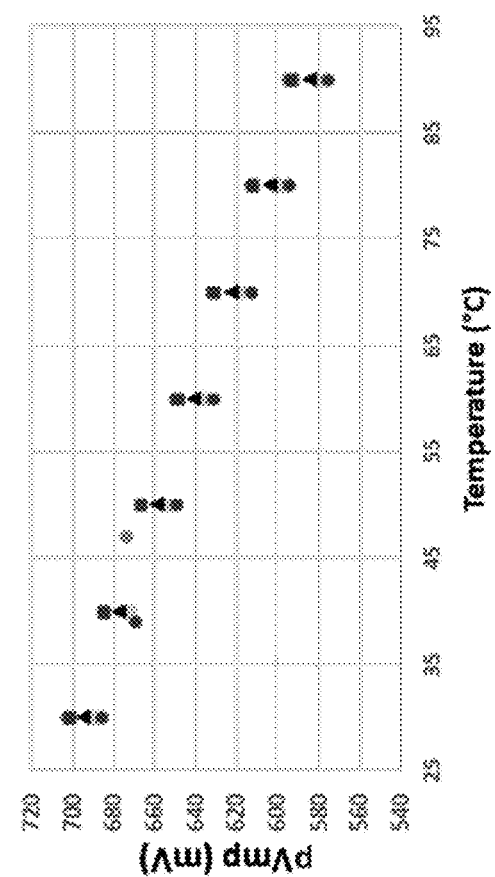
FIG. 15A is a graphical representation of $V_{OC}$ as a function of temperature.
Figure 15B:
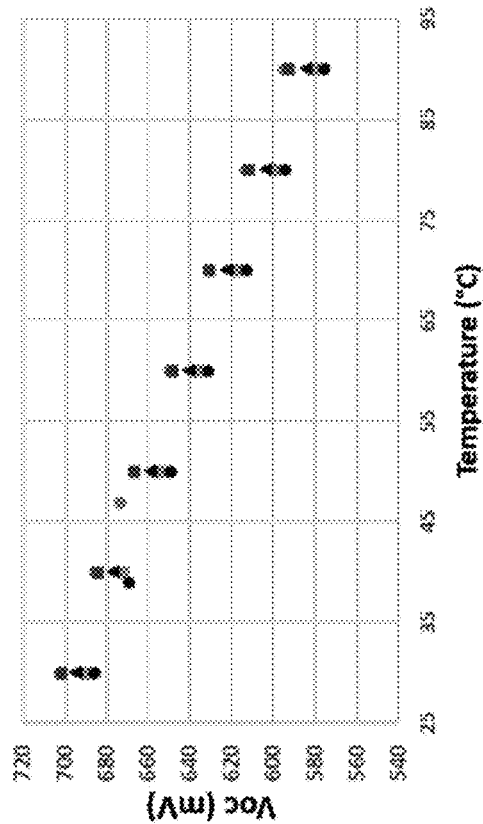
FIG. 15B is a graphical representation of pseudo $V_{MP}$ ($pV_{MP}$) as a function of temperature.
Figure 15C:
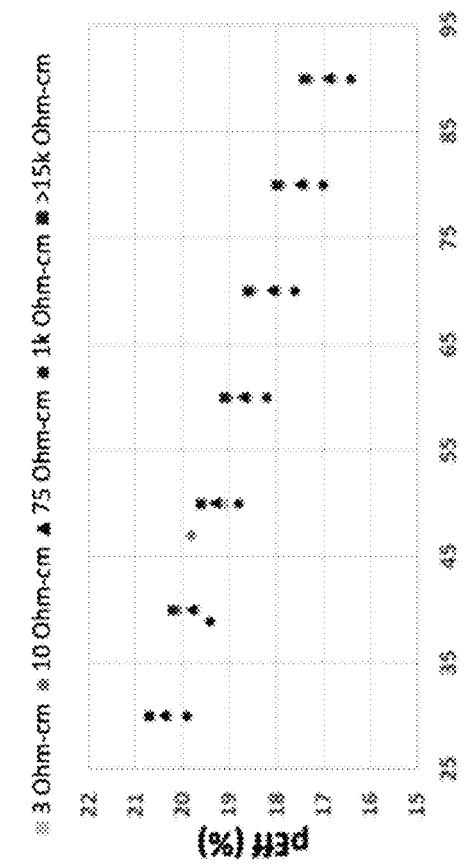
FIG. 15C is a graphical representation of pseudo FF (pFF) as a function of temperature.
Figure 15D:
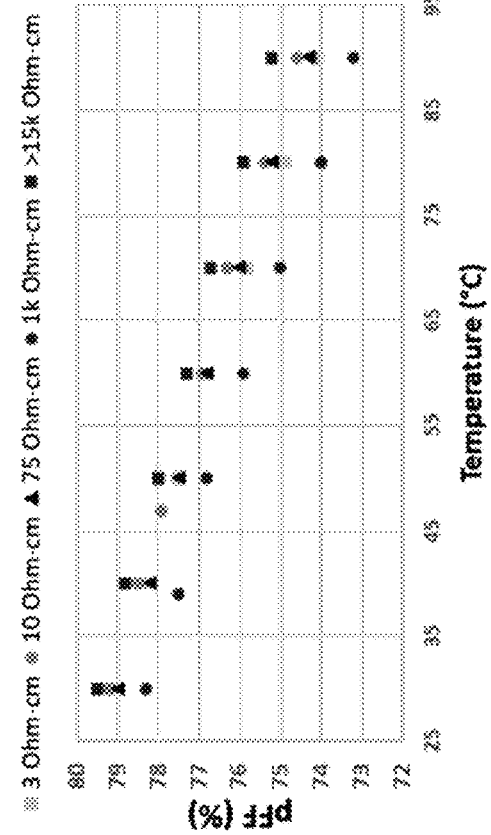
FIG. 15D is a graphical representation of pseudo efficiency (pEff) as a function of temperature.

FIGS. 15A-15D show how different pseudo I-V parameters measured in Suns-$V_{OC}$ vary as a function of temperature in 200 μm-thick silicon heterojunction solar cells manufactured on wafers with bulk resistivities between 1 Ω-cm and 15 k Ω-cm. FIG. 15A is a graphical representation of $V_{OC}$ as a function of temperature. FIG. 15B is a graphical representation of pseudo $V_{MP}$ (p$V_{MP}$) as a function of temperature. FIG. 15C is a graphical representation of pseudo FF (pFF) as a function of temperature. FIG. 15D is a graphical representation of pseudo efficiency (pEff) as a function of temperature. The trends in FIGS. 15A-15D are similar to the implied parameters and are independent of the bulk resistivity of the wafers.

Figure 16B:
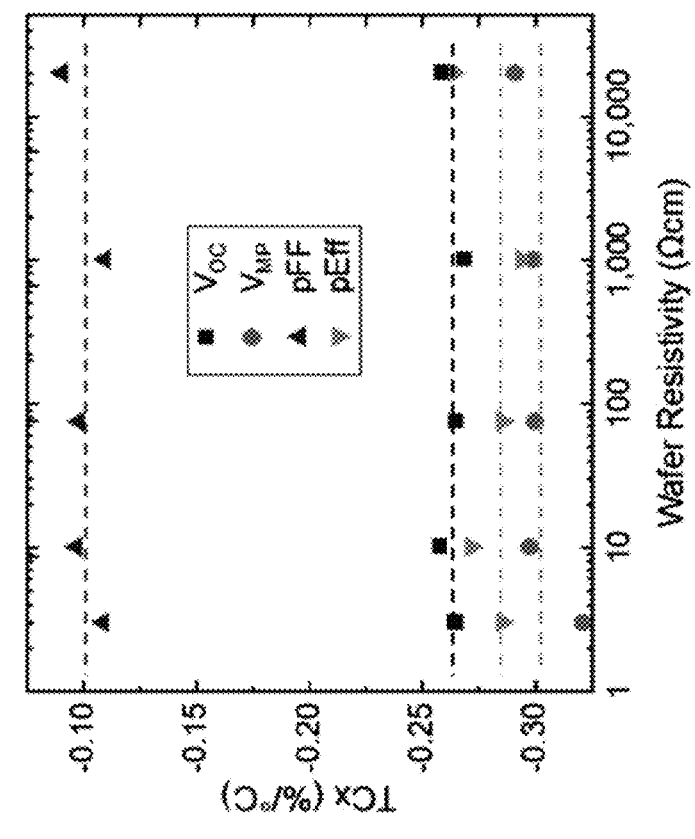
FIG. 16B is a graphical representation of thermal coefficients for pseudo I-V parameters of samples manufactured on wafers with bulk resistivities between 1 Ω-cm and 15 k Ω-cm.
Figure 16A:
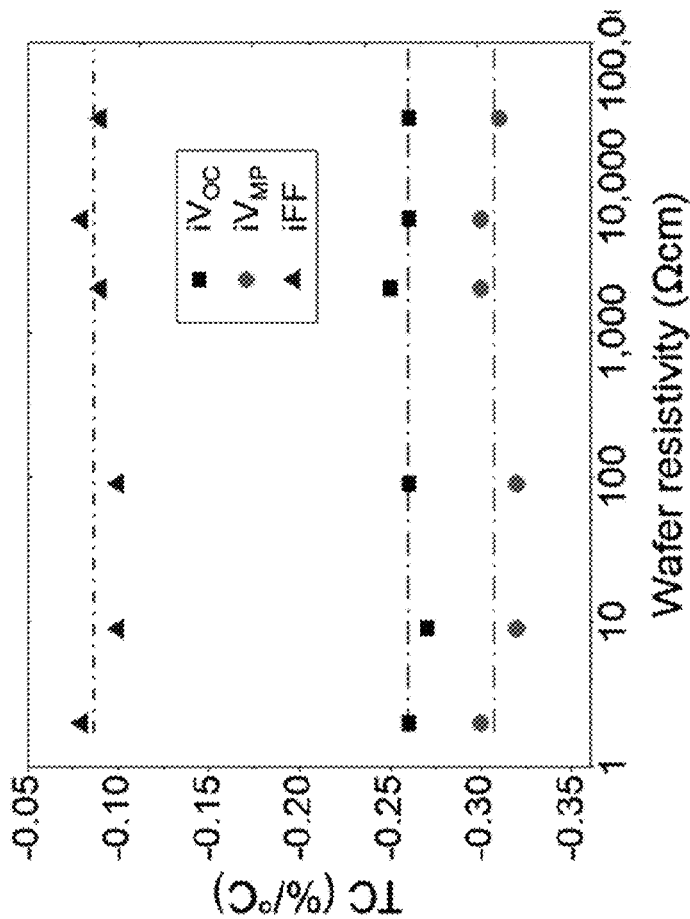
FIG. 16A is a graphical representation of thermal coefficients for implied current-voltage (I-V) parameters of samples manufactured on wafers with bulk resistivities between 1 Ω-cm and 15 k Ω-cm.

FIG. 16A is a graphical representation of thermal coefficients for implied I-V parameters (see FIGS. 11A and 11B) of samples manufactured on wafers with bulk resistivities between 1 Ω-cm and 15 k Ω-cm. FIG. 16B is a graphical representation of thermal coefficients for pseudo I-V parameters (see FIGS. 15A-15D) of samples manufactured on wafers with bulk resistivities between 1 Ω-cm and 15 k Ω-cm. The thermal coefficients are shown to be independent of the bulk resistivity and comparable to values previously reported on standard bulk resistivities.

Figure 17:
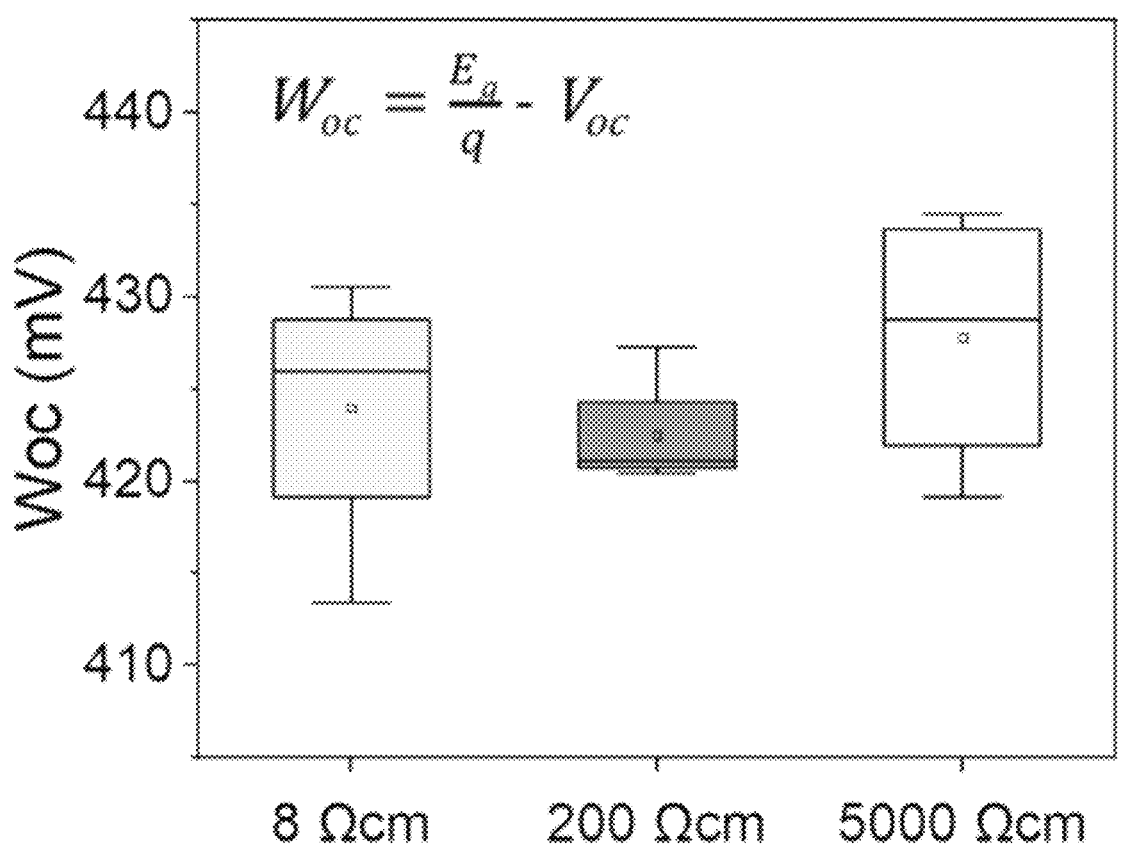
FIG. 17 is a graphical representation of a bandgap voltage offset at open circuit ($W_{OC}$) of silicon heterojunction solar cells manufactured using different bulk resistivities at 1 sun and 25° C.

FIG. 17 is a graphical representation of a bandgap voltage offset at open circuit ($W_{OC}$) of silicon heterojunction solar cells manufactured using different bulk resistivities at 1 sun and 25° C. The $W_{OC}$ is calculated from the pseudo I-V measurements. Similar $W_{OC}$ is seen across the entire bulk resistivity range. These values are reported on 400 μm-thick wafers limiting, in part, the achievement of lower $W_{OC}$. For thinner cells with same surface and bulk properties the $W_{OC}$ would be lower (note: the $W_{OC}$ is defined by the difference between bandgap and open circuit voltage. Lower $W_{OC}$ is better than higher since it means that the $V_{OC}$ is closer to its limited defined by the bandgap of the absorber).

Figure 18B:
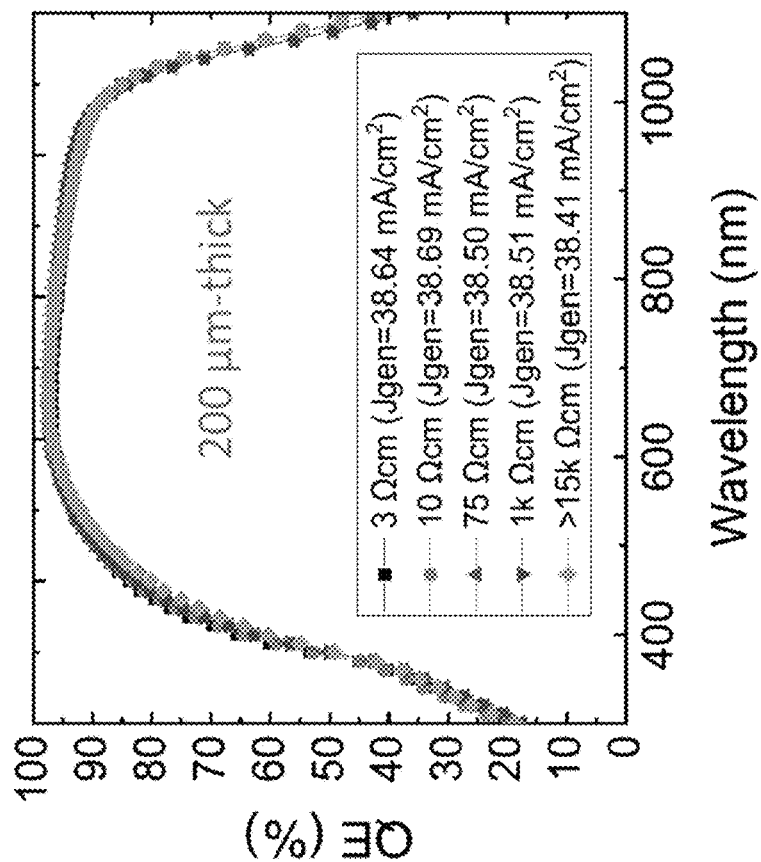
FIG. 18B is a graphical representation of QE measurements for silicon heterojunction solar cells manufactured on wafers with bulk resistivities between 1 Ω-cm and 15 k Ω-cm and thicknesses of 200 μm.
Figure 18A:
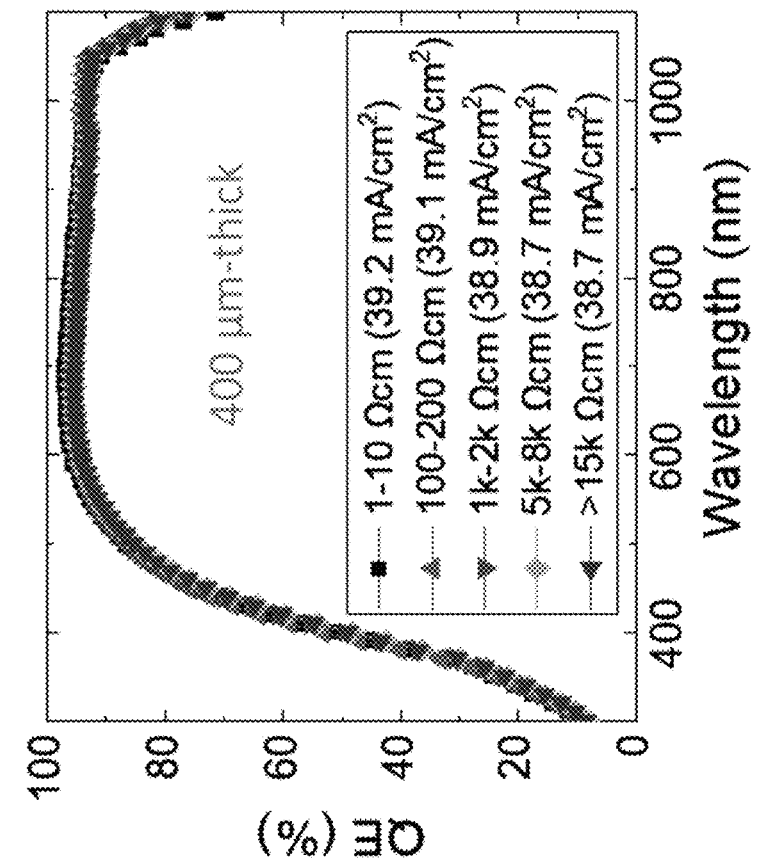
FIG. 18A is a graphical representation of external quantum efficiency (QE) measurements for silicon heterojunction solar cells manufactured on wafers with bulk resistivities between 1 Ω-cm and 15 k Ω-cm and thicknesses of 400 μm.

FIG. 18A is a graphical representation of external quantum efficiency (QE) measurements for silicon heterojunction solar cells manufactured on wafers with bulk resistivities between 1 Ω-cm and 15 k Ω-cm and thicknesses of 400 μm. FIG. 18B is a graphical representation of QE measurements for silicon heterojunction solar cells manufactured on wafers with bulk resistivities between 1 Ω-cm and 15 k Ω-cm and thicknesses of 200 μm. There is no significant difference in generation current between wafers with different bulk resistivities.

Figure 19A:
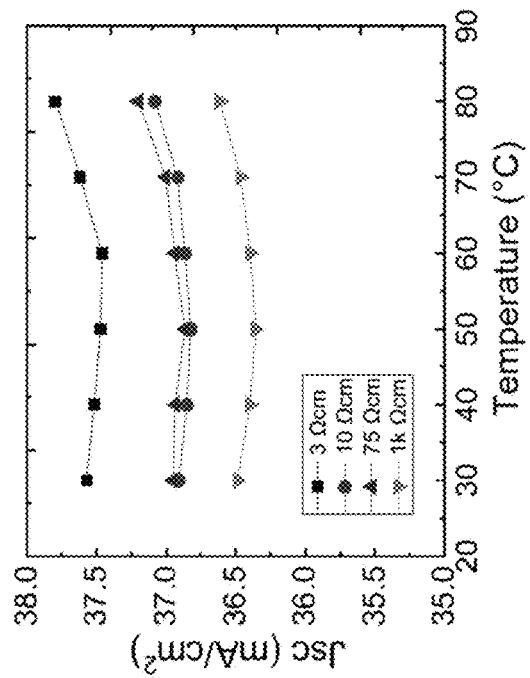
FIG. 19A is a graphical representation of measured $V_{OC}$ on 200 μm-thick silicon heterojunction solar cells manufactured using different bulk resistivities.
Figure 19B:
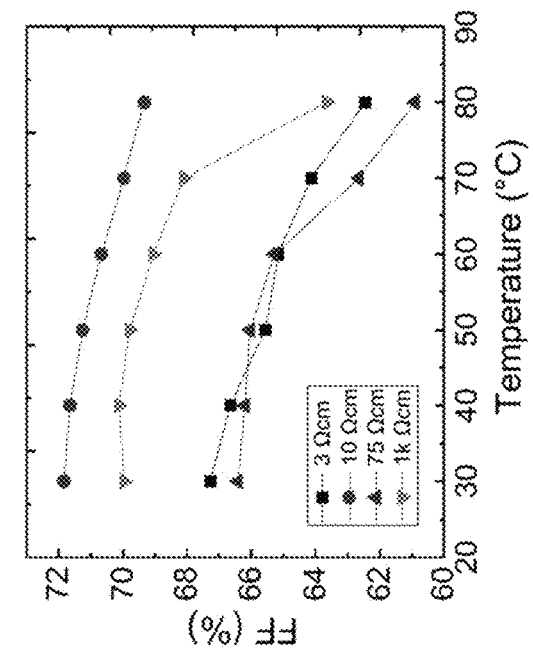
FIG. 19B is a graphical representation of measured short circuit current ($J_{SC}$) on 200 μm-thick silicon heterojunction solar cells manufactured using different bulk resistivities.
Figure 19C:
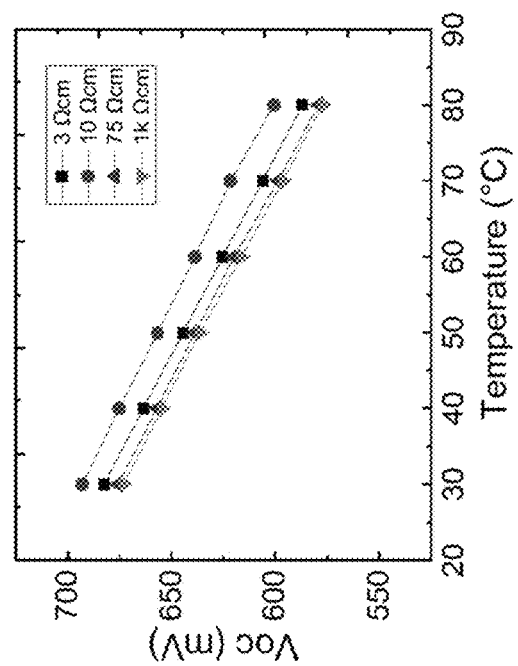
FIG. 19C is a graphical representation of measured efficiency on 200 μm-thick silicon heterojunction solar cells manufactured using different bulk resistivities.
Figure 19D:
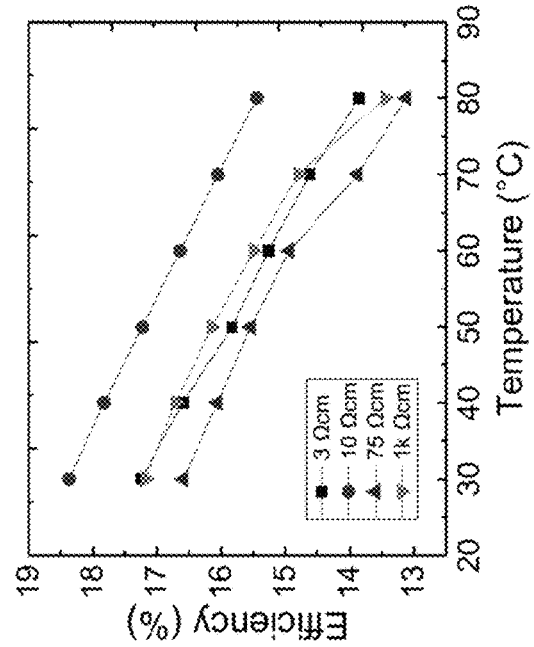
FIG. 19D is a graphical representation of measured FF on 200 μm-thick silicon heterojunction solar cells manufactured using different bulk resistivities.

FIGS. 19A-19D illustrate Light-IV parameters performed using a Sinton Flash IV tester at temperatures between 30-80° C. FIG. 19A is a graphical representation of measured $V_{OC}$ on 200 μm-thick silicon heterojunction solar cells manufactured using different bulk resistivities. FIG. 19B is a graphical representation of measured short circuit current ($J_{SC}$) on 200 μm-thick silicon heterojunction solar cells manufactured using different bulk resistivities. FIG. 19C is a graphical representation of measured efficiency on 200 μm-thick silicon heterojunction solar cells manufactured using different bulk resistivities. FIG. 19D is a graphical representation of measured FF on 200 μm-thick silicon heterojunction solar cells manufactured using different bulk resistivities.

The voltage response to temperature is normal. The current, $J_{SC}$, is expected to increase slightly with temperature and almost linearly. Due to constrains in the I-V tool, the current could not be measured precisely for the different temperatures. The calibration sample in the system is only calibrated for STC temperature, i.e., 25° C. and factors of correction were applied.

Figures 20A, 20B, 20C:
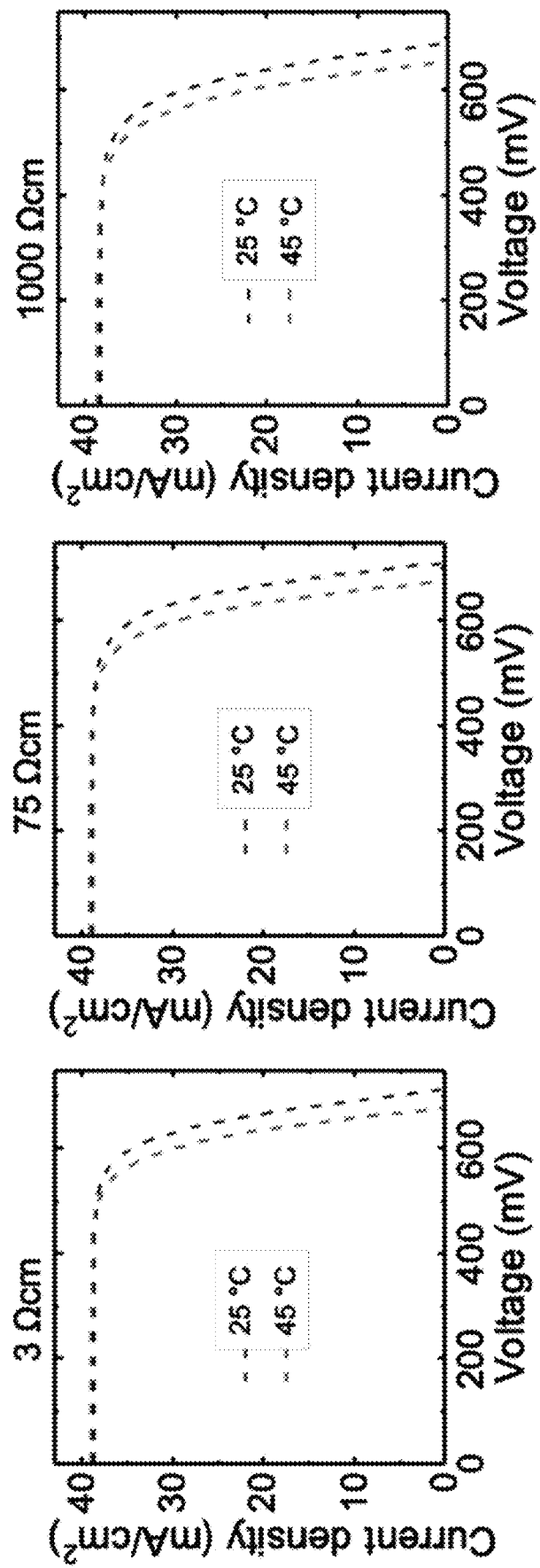
FIG. 20A is a graphical representation of a Light-IV curve measured for a 200 μm-thick silicon heterojunction solar cell manufactured using a 3 Ω-cm bulk resistivity.
FIG. 20B is a graphical representation of a Light-IV curve measured for a 200 μm-thick silicon heterojunction solar cell manufactured using a 75 Ω-cm bulk resistivity.
FIG. 20C is a graphical representation of a Light-IV curve measured for a 200 μm-thick silicon heterojunction solar cell manufactured using a 1000 Ω-cm bulk resistivity.

FIGS. 20A-20C illustrate Light-IV curves measured using a temperature dependent calibration sample. FIG. 20A is a graphical representation of a Light-IV curve measured for a 200 µm-thick silicon heterojunction solar cell manufactured using a 3 Ω-cm bulk resistivity. FIG. 20B is a graphical representation of a Light-IV curve measured for a 200 µm-thick silicon heterojunction solar cell manufactured using a 75 Ω-cm bulk resistivity. FIG. 20C is a graphical representation of a Light-IV curve measured for a 200 µm-thick silicon heterojunction solar cell manufactured using a 1000 Ω-cm bulk resistivity. The measurements in FIGS. 20A-20C and Table 1 below show a similar trend to FIGS. 16A, 16B, and 17 and they are comparable with the values previously reported on standard resistivity wafers. As previously addressed, these results suggest that the TCs are independent of the bulk resistivity of the solar cells.

TABLE 1

Light-IV curves measured using temperature dependent calibration sample. The samples were 200 µm-thick silicon heterojunction solar cells manufactured using different bulk resistivities.

| Sample | $V_{oc}$ (mV) | TC (%/° C.) | $J_{sc}$ (mA/cm$^2$) | TC (%/° C.) | FF (%) | TC (%/° C.) | Eff (%) | TC (%/° C.) |
|---|---|---|---|---|---|---|---|---|
| 3 Ω-cm (25° C.) | 713 | −0.25 | 38.7 | 0.03 | 76.2 | −0.04 | 21.0 | −0.26 |
| 3 Ω-cm (45° C.) | 678 | | 38.9 | | 75.6 | | 19.9 | |
| 75 Ω-cm (25° C.) | 711 | −0.25 | 38.9 | 0.03 | 75.7 | −0.07 | 20.9 | −0.30 |
| 75 Ω-cm (45° C.) | 675 | | 39.1 | | 74.6 | | 19.7 | |
| 1k Ω-cm (25° C.) | 690 | −0.25 | 38.3 | 0.04 | 73 | −0.07 | 19.3 | −0.28 |
| 1k Ω-cm (45° C.) | 655 | | 38.6 | | 72 | | 18.2 | |

Figure 21A:
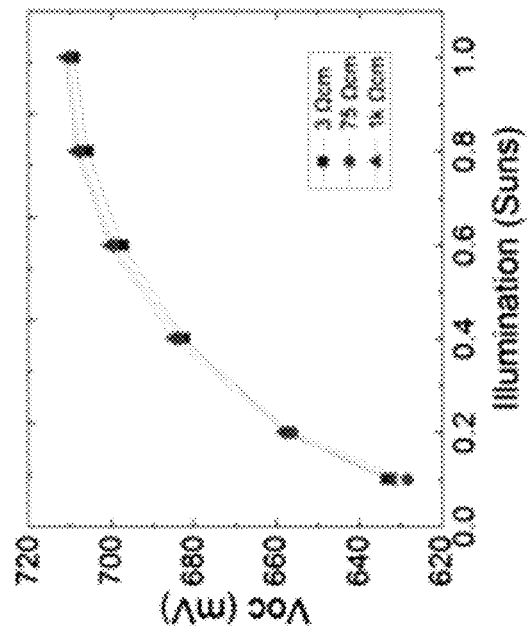
FIG. 21A is a graphical representation of efficiency measured at different illuminations.
Figure 21B:
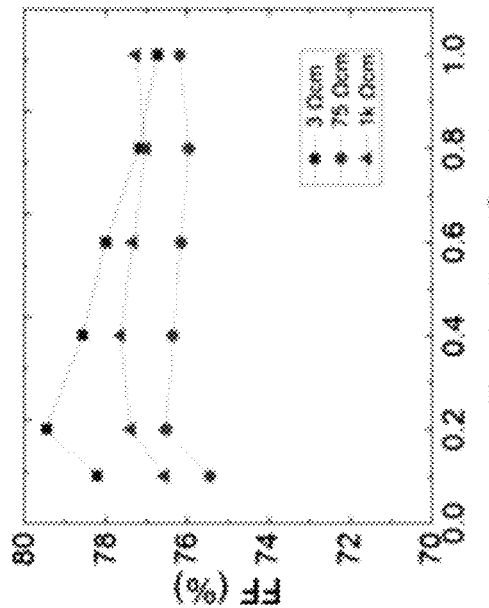
FIG. 21B is a graphical representation of $V_{OC}$ measured at different illuminations.
Figure 21C:
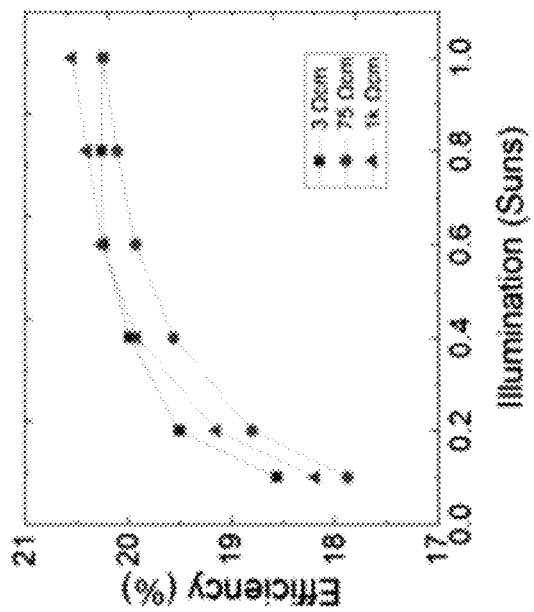
FIG. 21C is a graphical representation of $J_{SC}$ measured at different illuminations.
Figure 21D:
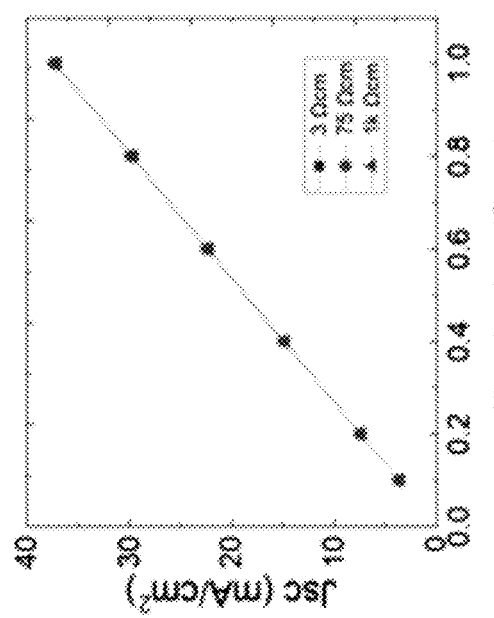
FIG. 21D is a graphical representation of FF measured at different illuminations.

FIGS. 21A-21D illustrate Light-IV parameters measured on 200 µm-thick silicon heterojunction solar cells with different bulk resistivities using a Light-IV tester. FIG. 21A is a graphical representation of efficiency measured at different illuminations. FIG. 21B is a graphical representation of $V_{OC}$ measured at different illuminations. FIG. 21C is a graphical representation of $J_{SC}$ measured at different illuminations. FIG. 21D is a graphical representation of FF measured at different illuminations. The $J_{SC}$ increases linearly with the incoming photon flux. The $V_{OC}$ increases logarithmically with current. The FF increases then decreases with increase in illumination due to the competing effects of series resistance and shunt resistance. At higher illumination intensities, the series resistance is dominant because of higher currents; at lower illumination intensities the shunt resistance is dominant.

B. Influence of Bulk Resistivity on Reliability

Whether the bulk resistivity influences the reliability of the modules is analyzed, namely in terms of breakdown voltage and light induced degradation (LID). The overheating of solar cells can be caused by large breakdown current which can destroy the solar cell unless the current is limited, or a heat sink is provided. Solar cells in modules are connected in series. When a solar cell is shaded, it produces less current than unshaded cells. Thus, the shaded cell limits the overall current in the circuit. The shaded cell is reverse biased and large power dissipation occurs in this cell, which causes the temperature in a small area to rise leading to hot spots. Bypass diodes are used to avoid harm in these cells.

For practical reasons it is not possible to have bypass diodes in every cell of a photovoltaic module. Bypass diodes are usually placed across around solar cells. The reverse bias across the shaded or poor cell becomes the sum of forward bias voltage of the other cells connected in series sharing the same bypass diode and the voltage of the bypass diode. Thus, it is important to have high reverse breakdown voltage in a solar cell, so that it can withstand the reverse voltage without getting damaged. It would be more than sufficient to have breakdown voltage over 20 V (assuming 0.7 V and 20 cells in a string, the shaded cell will not experience reverse voltage more than 15 V).

There is limited literature on typical breakdown voltages of silicon heterojunction solar cells. In multi-crystalline solar cells, breakdown occurs at very low voltages (around 13 V or below) because of impurities and defects. The interdigitated back contact (IBC) cells have lower breakdown voltages (~3.7 V) by design to have a low power dissipation in reverse bias.

C. Breakdown Voltage

Figure 22A:
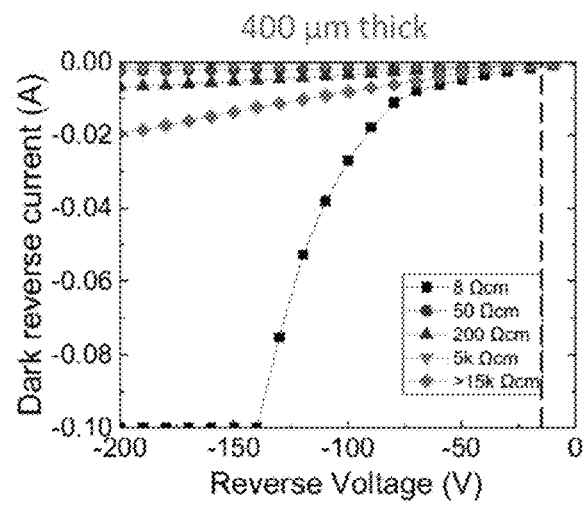
FIG. 22A is a graphical representation of breakdown voltage for 200 μm-thick silicon heterojunction solar cells manufactured with wafers with different bulk resistivities.
Figure 22B:
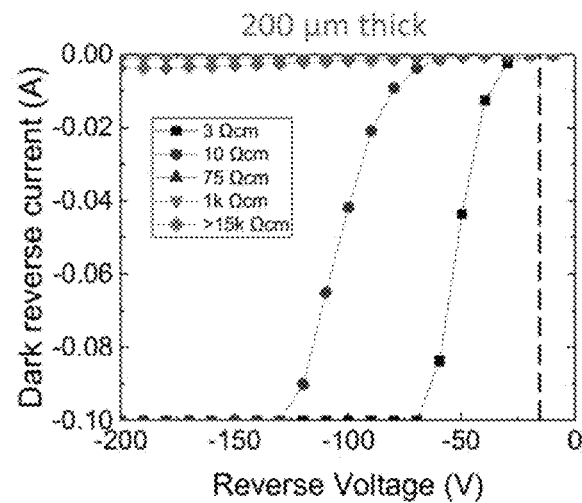
FIG. 22B is a graphical representation of breakdown voltage for 400 μm-thick silicon heterojunction solar cells manufactured with wafers with different bulk resistivities.

FIG. 22A is a graphical representation of breakdown voltage for 200 µm-thick silicon heterojunction solar cells manufactured with wafers with different bulk resistivities. FIG. 22B is a graphical representation of breakdown voltage for 400 µm-thick silicon heterojunction solar cells manufactured with wafers with different bulk resistivities. FIGS. 22A and 22B show the results of applying dark reverse bias voltage to cells of different resistivities. The automated system has a limit of −200 V and the current was limited to 0.1 A to avoid damaging the cells. The results are consistent with avalanche breakdown, where the breakdown voltage decreases with increasing of the doping concentration. None of the high resistivity cells experienced breakdown at −200 V. Measurements with a different power source did not show breakdown at −1000 V, where the measurements were terminated due to safety considerations. Typical diffused junction cells have a reverse bias breakdown voltage under 50 V, much lower than for the high-resistivity silicon heterojunction cells described herein.

Figure 22C:
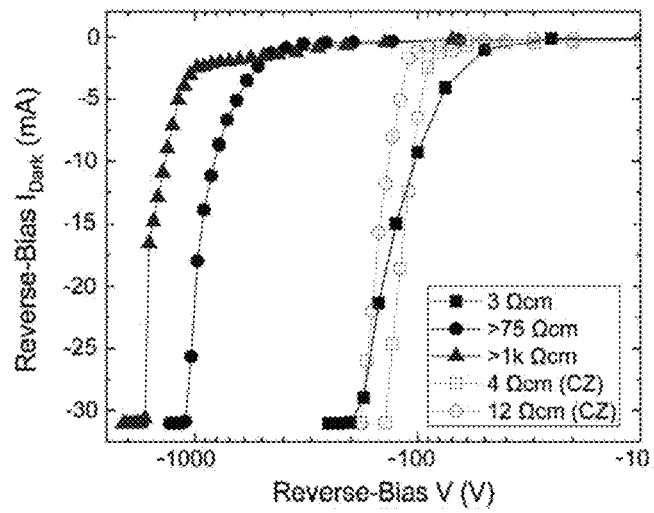
FIG. 22C is a graphical representation of breakdown voltage for silicon heterojunction solar cells manufactured with different bulk resistivities as a function of reverse-bias voltage.

FIG. 22C is a graphical representation of breakdown voltage for silicon heterojunction solar cells manufactured with different bulk resistivities as a function of reverse-bias voltage. As expected, the breakdown voltage increases with the bulk resistivity. Measurements using n-type Czochralski (CZ) silicon heterojunction solar cells were included in the figure for comparison. The 3 Ω-cm solar cell starts to breakdown around −30 V to −50 V, while the over 1000 Ω-cm solar cell only starts to breakdown for applied reverse-bias voltages larger than −1000 V.

To put in perspective the potential of having solar cells with very high breakdown voltages, a typical 144 half-cells module without bypass diodes was simulated using the Bishop's breakdown voltage model, which has been widely used to simulate mismatch effects in shaded PV modules. The 144 half-cells modules are usually formed by two subsets of 72 half-cells connected in parallel. As a result, these modules have open-circuit voltages comparable with 72 full-cells modules, i.e., typically below 50 V. Because the two subsets of 72 half-cells are connected in parallel, to model the breakdown voltage, each subset is modeled independently.

Figure 23A:
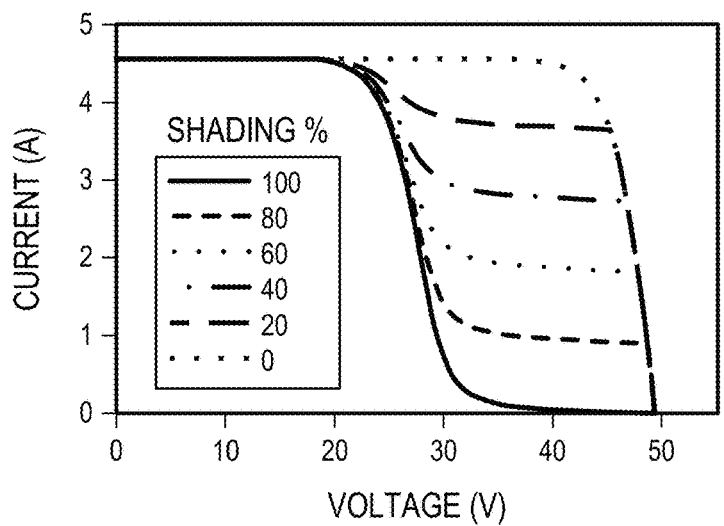
FIG. 23A is a graphical representation of I-V characteristics of a 72 half-cells module subset as a function of shading percentage of a single-shaded half-cell.

FIG. 23A is a graphical representation of I-V characteristics of a 72 half-cells module subset as a function of shading percentage of a single-shaded half-cell. The other 71 half-cells operate at full output power. A typical solar cell has a breakdown voltage in the region of −20 V. In the module subset, as long as the shading percentage is below 50%, the shaded half-cell stays in forward-bias.

Figure 23B:
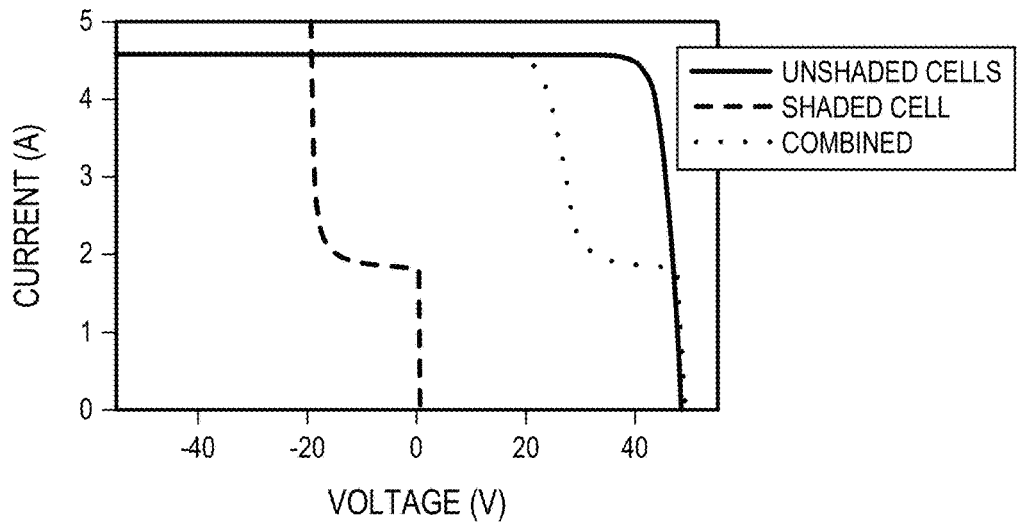
FIG. 23B is a graphical representation of I-V characteristics of a 72 half-cells module with a −20 V breakdown voltage with 60% shading.

FIG. 23B is a graphical representation of I-V characteristics of a 72 half-cells module with a −20 V breakdown voltage with 60% shading. For higher shading percentages, the shaded half-cell goes into reverse breakdown. This is usually catastrophic as breakdown occurs in hot spots rather than uniformly across the cell.

Figure 23C:
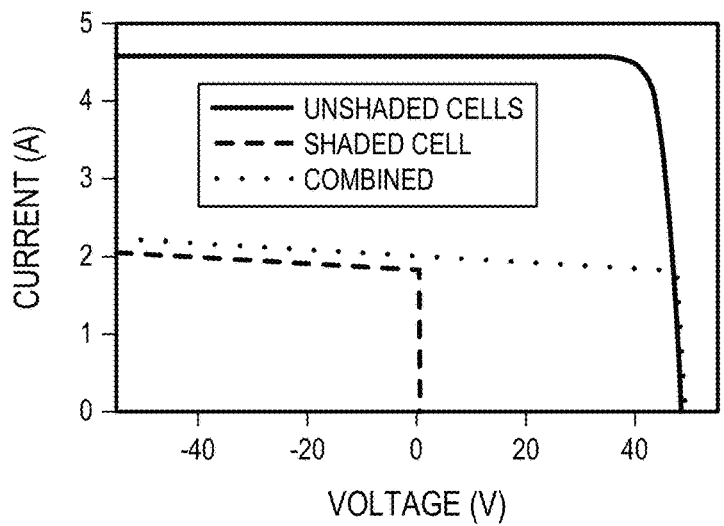
FIG. 23C is a graphical representation of I-V characteristics of a 72 half-cells module with a −1000 V breakdown voltage with 60% shading.

FIG. 23C is a graphical representation of I-V characteristics of a 72 half-cells module with a −1000 V breakdown voltage with 60% shading. In a cell with very high breakdown (greater than the voltage of all the cells in the string), the output power of the module subset drops as the shading percentage increases. While the power drops to low levels, the shaded half-cell does not go into reverse-bias, and there is no damage to the shaded half-cell as it is always in forward-bias and producing power.

D. Light-Induced Degradation

The LID in CZ p-type wafers is caused due to boron-oxygen (B—O) defects which can be usually recovered by annealing. LID on n-type silicon heterojunction cells has been observed. This degradation has been attributed to the presence of high interstitial oxygen concentration and thermal donors in the seed end of the CZ ingot and can be reversed by thermal treatment. In embodiments described herein this type of degradation is not expected as they use n-type float zone (FZ) wafers. However, degradation of the effective lifetime has been observed when samples passivated with intrinsic hydrogenated amorphous silicon (a-Si:H) were light-soaked. The lifetimes are recoverable upon annealing. The degradation is attributed to a deterioration of the passivation properties of the a-Si:H layers.

Figure 24B:
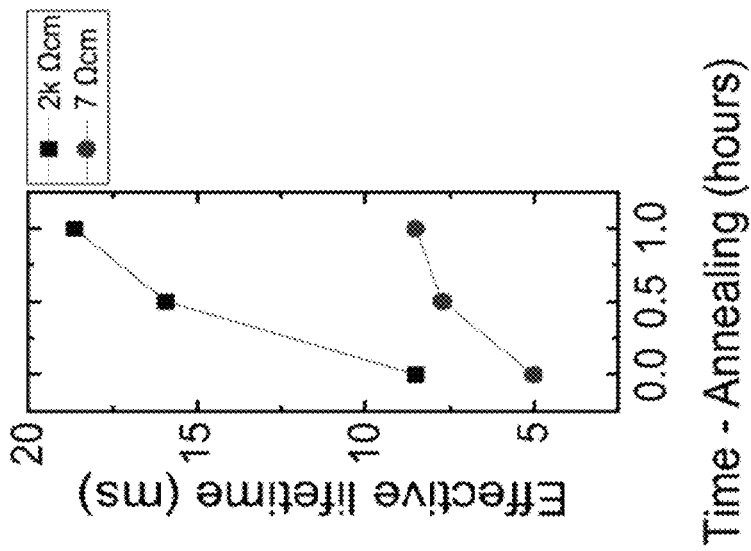
FIG. 24B is a graphical representation of effective lifetime if the same samples after annealing.
Figure 24A:
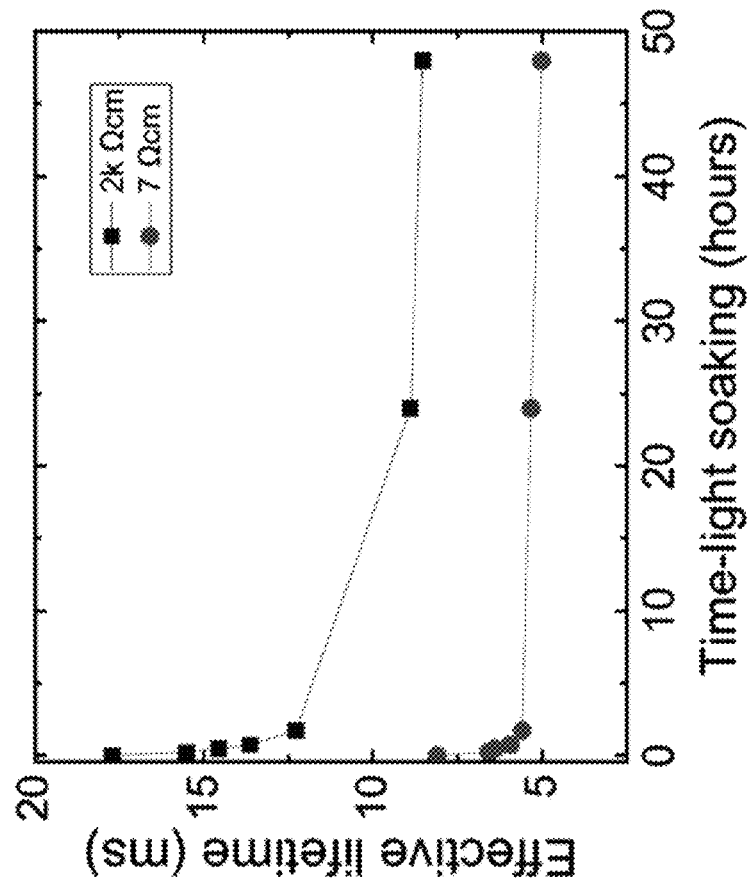
FIG. 24A is a graphical representation of effective lifetime as a function of light soaking of samples passivated with intrinsic hydrogenated amorphous silicon (a-Si:H).

FIG. 24A is a graphical representation of effective lifetime as a function of light soaking of samples passivated with intrinsic a-Si:H. FIG. 24B is a graphical representation of effective lifetime if the same samples after annealing. During light soaking the substrate was maintained at 62±° C. FIGS. 24A and 24B illustrate degradation of the lifetime in the intrinsic a-Si:H passivated samples and lifetime recovery after annealing.

Figure 25B:
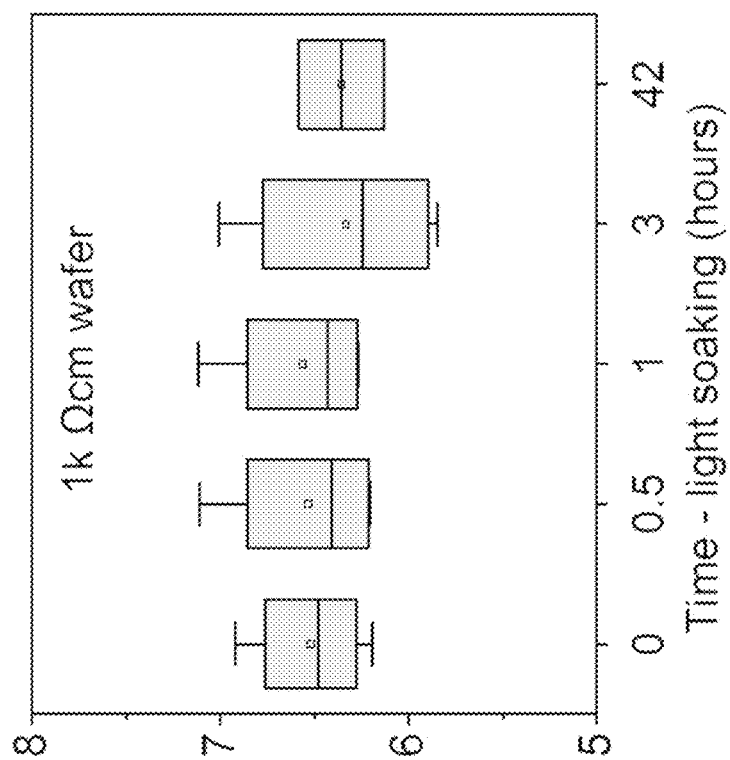
FIG. 25B is a graphical representation of effective lifetime as a function of light soaking of a silicon heterojunction solar cell using a 1 k Ω-cm wafer.
Figure 25A:
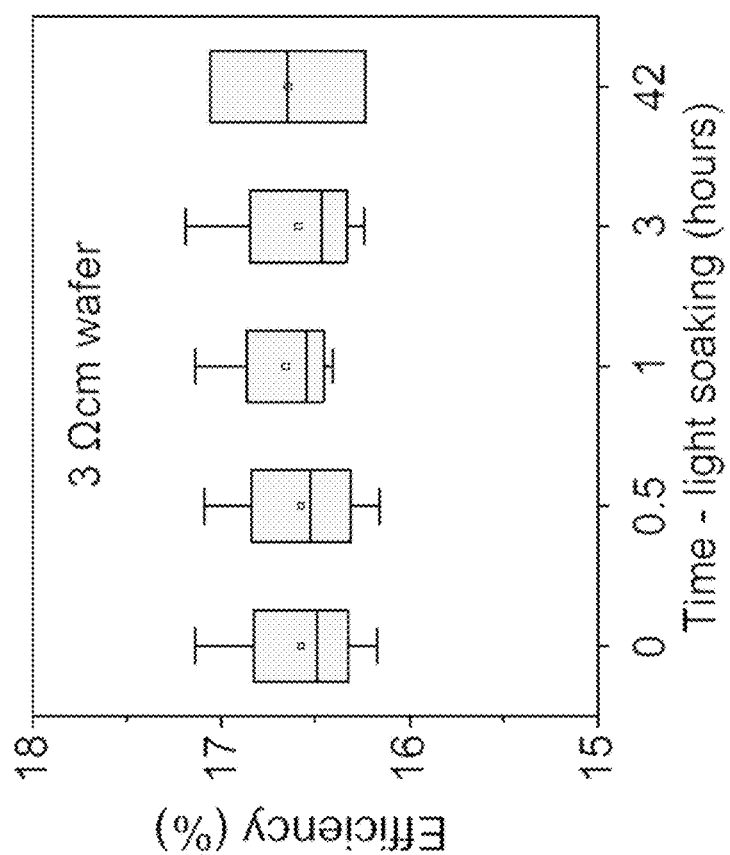
FIG. 25A is a graphical representation of effective lifetime as a function of light soaking of a silicon heterojunction solar cell using a 3 Ω-cm wafer.

FIG. 25A is a graphical representation of effective lifetime as a function of light soaking of a silicon heterojunction solar cell using a 3 Ω-cm wafer. FIG. 25B is a graphical representation of effective lifetime as a function of light soaking of a silicon heterojunction solar cell using a 1 k Ω-cm wafer. During light soaking the substrate was maintained at 62±° C. There is no significant change in efficiency for the silicon heterojunction solar cells during light soaking.

Considering the performance of high resistivity wafers, the efficiency attainable by >15 k Ω-cm bulk resistivity wafers is estimated in Table 2.

TABLE 2

Estimated efficiencies considering the experimental lifetimes measured in 200 µm thick and >15k Ω-cm wafers.

| $J_{sc}$ assumptions | $J_{sc}$ (mA/cm$^2$) | Experimental Lifetime (ms) | $iV_{oc}$ (mV) | iFF (%) | Estimated Efficiency (%) |
|---|---|---|---|---|---|
| Lambertian light trapping limit | 44.2 | 5.5 | 742 | 84.9 | 27.8 |
| Kaneka | 42.5 | 5.5 | 741 | 84.7 | 26.7 |
| $J_{sc}$ in lab | 40 | 5.5 | 740 | 84.5 | 25 |

Different $J_{SC}$ were assumed, including the $J_{SC}$ attainable in lab for a 200 µm thick wafer, the $J_{SC}$ of the 200 µm thick silicon heterojunction Kaneka record cell, and the case limit of the Lambertian light trapping for a 200 µm thick silicon absorber. The experimental results, supported by the simulations, show similar thermal coefficients regardless of the wafer's bulk resistivity. These results are comparable to values previously reported for standard resistivity wafers. Experimental solar cells show a similar response to different illumination levels regardless of the wafer's bulk resistivity. High resistivity wafers show higher breakdown voltage than lower resistivity wafers, but even for lower resistivity wafers the breakdown voltage seems to be high enough to avoid catastrophic failure in the cell. LID was not observed in the silicon heterojunction solar cells of embodiments described herein after light soaking.

V. Process for Providing a Photovoltaic Device

Figure 26:
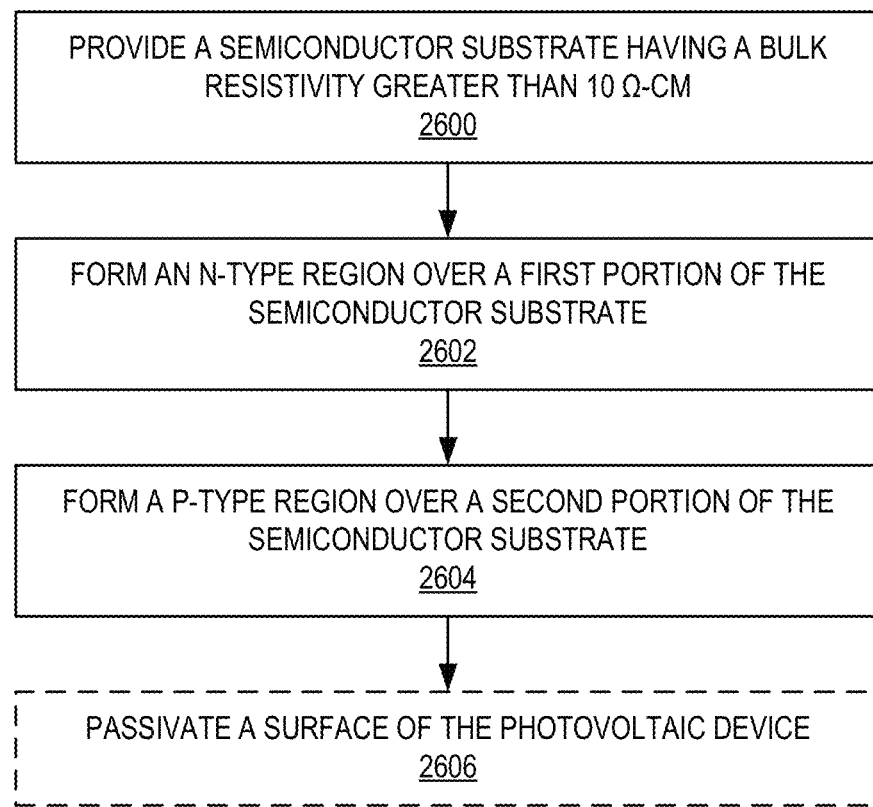
FIG. 26 is a flow diagram illustrating a process for providing a photovoltaic device.

FIG. 26 is a flow diagram illustrating a process for providing a photovoltaic device. Dashed boxes represent optional steps. The process begins at operation 2600, with providing a semiconductor substrate having a bulk resistivity greater than 10 Ω-cm. In an exemplary aspect, the semiconductor substrate is a crystalline silicon substrate that is undoped or lightly doped. The process continues at operation 2602, with forming an n-type region over a first portion of the semiconductor substrate. The process continues at operation 2604, with forming a p-type region over a second portion of the semiconductor substrate. The n-type region and the p-type region form a heterojunction of a solar cell. The process optionally continues at operation 2606, with passivating a surface of the photovoltaic device. The process can include depositing some or all of the layers described with respect to FIGS. 9A and 9B above.

Although the operations of FIG. 26 are illustrated in a series, this is for illustrative purposes and the operations are not necessarily order dependent. Some operations may be performed in a different order than that presented. Further, processes within the scope of this disclosure may include fewer or more steps than those illustrated in FIG. 26.

Those skilled in the art will recognize improvements and modifications to the preferred embodiments of the present disclosure. All such improvements and modifications are considered within the scope of the concepts disclosed herein and the claims that follow.

What is claimed is:

1. A solar cell, comprising:
a semiconductor substrate comprising a crystalline silicon wafer, the semiconductor substrate having a bulk resistivity greater than 10 ohms centimeter (Ω-cm), wherein the semiconductor substrate is undoped;
an n-type region over a first portion that includes a first surface of the semiconductor substrate, wherein the n-type region comprises an n-doped layer of hydrogenated amorphous silicon (a-Si:H) deposited over a first side of the semiconductor substrate;
a p-type region over a second portion that includes a second surface of the semiconductor substrate, wherein the n-type region and the p-type region form a heterojunction of the solar cell and wherein the first surface is oppositely disposed from the second surface and wherein the p-type region comprises a p-doped layer of a-Si:H deposited over a second side of the semiconductor substrate opposite the first side; and
an intrinsic layer of a-Si:H between the semiconductor substrate and the n-doped layer of a-Si:H.

2. The solar cell of claim 1, further comprising a passivation layer over a surface of the solar cell.

3. A method for providing a photovoltaic device, the method comprising:
providing a semiconductor substrate comprising a crystalline silicon wafer, the semiconductor substrate having a bulk resistivity greater than 10 ohms centimeter (Ω-cm), wherein the semiconductor substrate is undoped;
forming an n-type region over a first portion that includes a first surface of the semiconductor substrate;
forming an intrinsic layer between the n-type region and the semiconductor substrate;
forming a p-type region over a second portion that includes a second surface of the semiconductor substrate, wherein the n-type region and the p-type region form a heterojunction of a solar cell and wherein the first surface is oppositely disposed from the second surface; and
passivating a surface of the photovoltaic device.

4. The method of claim 3, further comprising forming a second intrinsic layer between the p-type region and the semiconductor substrate.

5. A method for providing a photovoltaic device, the method comprising:
providing a semiconductor substrate comprising a crystalline silicon wafer, the semiconductor substrate having a bulk resistivity greater than 10 ohms centimeter (Ω-cm), wherein the semiconductor substrate is undoped;
forming an n-type region over a first portion that includes a first surface of the semiconductor substrate;
forming a p-type region over a second portion that includes a second surface of the semiconductor substrate, wherein the n-type region and the p-type region form a heterojunction of a solar cell and wherein the first surface is oppositely disposed from the second surface;
forming an intrinsic layer between the p-type region and the semiconductor substrate; and
passivating a surface of the photovoltaic device.

* * * * *